United States Patent
Mauder et al.

(10) Patent No.: US 10,950,718 B2
(45) Date of Patent: Mar. 16, 2021

(54) IGBT WITH FULLY DEPLETABLE N- AND P-CHANNEL REGIONS

(71) Applicant: Infineon Technologies Dresden GmbH & Co. KG, Dresden (DE)

(72) Inventors: Anton Mauder, Kolbermoor (DE); Thomas Kuenzig, Baldham (DE); Franz-Josef Niedernostheide, Hagen a. T.W. (DE); Christian Philipp Sandow, Haar (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/220,130

(22) Filed: Dec. 14, 2018

(65) Prior Publication Data
US 2019/0189789 A1    Jun. 20, 2019

(30) Foreign Application Priority Data
Dec. 15, 2017    (DE) ..................... 10 2017 130 092.9

(51) Int. Cl.
*H01L 29/739*        (2006.01)
*H01L 29/40*         (2006.01)
(Continued)

(52) U.S. Cl.
CPC ...... *H01L 29/7397* (2013.01); *H01L 29/0623* (2013.01); *H01L 29/0696* (2013.01);
(Continued)

(58) Field of Classification Search
CPC ................... H01L 29/7397; H01L 29/0696
See application file for complete search history.

(56) References Cited

U.S. PATENT DOCUMENTS

| 5,488,236 A | 1/1996 | Baliga et al. |
| 6,069,043 A | 5/2000 | Floyd et al. |
| (Continued) | | |

FOREIGN PATENT DOCUMENTS

| CN | 103996715 A | 8/2014 |
| CN | 104752506 A | 7/2015 |
| (Continued) | | |

*Primary Examiner* — Kenneth Parker
*Assistant Examiner* — Long H Le
(74) *Attorney, Agent, or Firm* — Murphy, Bilak & Homiller, PLLC

(57) ABSTRACT

A power semiconductor device has a semiconductor body coupled to first and second load terminal structures, the semiconductor body configured to conduct a load current during a conducting state of the device and having a drift region. The power semiconductor device includes a plurality of cells, each cell having: a first mesa in a first cell portion, the first mesa including: a first port region, and a first channel region, the first mesa exhibiting a total extension of less than 100 nm in a lateral direction, and a second mesa in a second cell portion including: a second port region, and a second channel region. A trench structure includes a control electrode structure configured to control the load current by inversion or accumulation. A guidance zone of the second conductivity type is below the second channel region and is displaced from the first and the second channel regions.

21 Claims, 20 Drawing Sheets

(51) Int. Cl.
  *H01L 29/423* (2006.01)
  *H01L 29/417* (2006.01)
  *H01L 29/06* (2006.01)
  *H01L 29/10* (2006.01)
  *H01L 29/66* (2006.01)

(52) U.S. Cl.
  CPC ........ *H01L 29/1033* (2013.01); *H01L 29/407* (2013.01); *H01L 29/417* (2013.01); *H01L 29/41708* (2013.01); *H01L 29/4236* (2013.01); *H01L 29/42376* (2013.01); *H01L 29/66348* (2013.01)

(56) References Cited

U.S. PATENT DOCUMENTS

| | | | |
|---|---|---|---|
| 6,392,273 B1 | 5/2002 | Chang | |
| 2004/0183080 A1* | 9/2004 | Kusumoto | H01L 23/485 257/77 |
| 2005/0045960 A1 | 3/2005 | Takahashi | |
| 2007/0001263 A1 | 1/2007 | Nakagawa | |
| 2007/0210356 A1 | 9/2007 | Henson | |
| 2009/0273024 A1 | 11/2009 | Hiller et al. | |
| 2009/0309647 A1 | 12/2009 | Lim et al. | |
| 2012/0118854 A1 | 5/2012 | Smayling et al. | |
| 2012/0168819 A1 | 7/2012 | Marino et al. | |
| 2012/0306464 A1 | 12/2012 | Hirler et al. | |
| 2013/0306982 A1 | 11/2013 | Kudou | |
| 2014/0077278 A1 | 3/2014 | Nozu | |
| 2014/0124895 A1* | 5/2014 | Salzman | H01L 29/7322 257/592 |
| 2015/0001596 A1* | 1/2015 | Lee | H01L 29/4238 257/288 |
| 2015/0015309 A1 | 1/2015 | Werber | |
| 2015/0042177 A1 | 2/2015 | Weyers et al. | |
| 2015/0097231 A1 | 4/2015 | Mathur et al. | |
| 2015/0137223 A1 | 5/2015 | Siemieniec et al. | |
| 2015/0179637 A1 | 6/2015 | Pfirsch et al. | |
| 2015/0349103 A1 | 12/2015 | Onozawa et al. | |
| 2016/0300913 A1 | 10/2016 | Siemieniec et al. | |
| 2018/0006027 A1* | 1/2018 | Mauder | H01L 29/0619 |
| 2018/0006109 A1* | 1/2018 | Mauder | H01L 29/7803 |
| 2018/0006110 A1* | 1/2018 | Mauder | H01L 29/7803 |
| 2018/0006115 A1 | 1/2018 | Mauder et al. | |

FOREIGN PATENT DOCUMENTS

| | | |
|---|---|---|
| CN | 105097923 A | 11/2015 |
| CN | 105702676 A | 6/2016 |
| CN | 105702731 A | 6/2016 |
| DE | 102005014714 A1 | 12/2005 |
| DE | 102012209192 A1 | 12/2012 |
| DE | 102014100249 A1 | 7/2014 |
| DE | 102014117364 A1 | 5/2015 |
| DE | 102014108913 A1 | 12/2015 |
| DE | 102014119543 A1 | 6/2016 |
| DE | 102015117994 A1 | 4/2017 |
| DE | 102016112017 A1 | 1/2018 |

\* cited by examiner

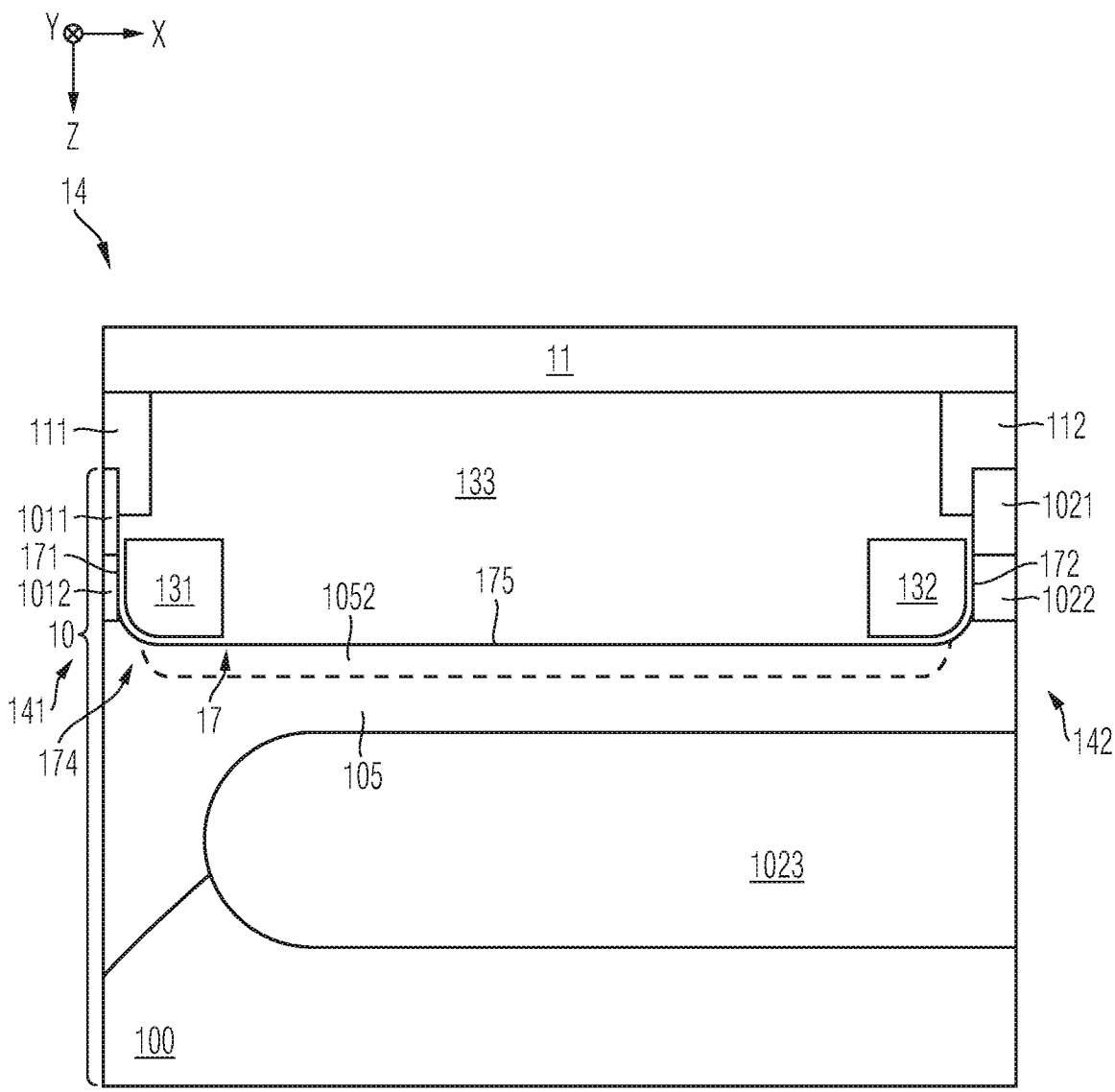

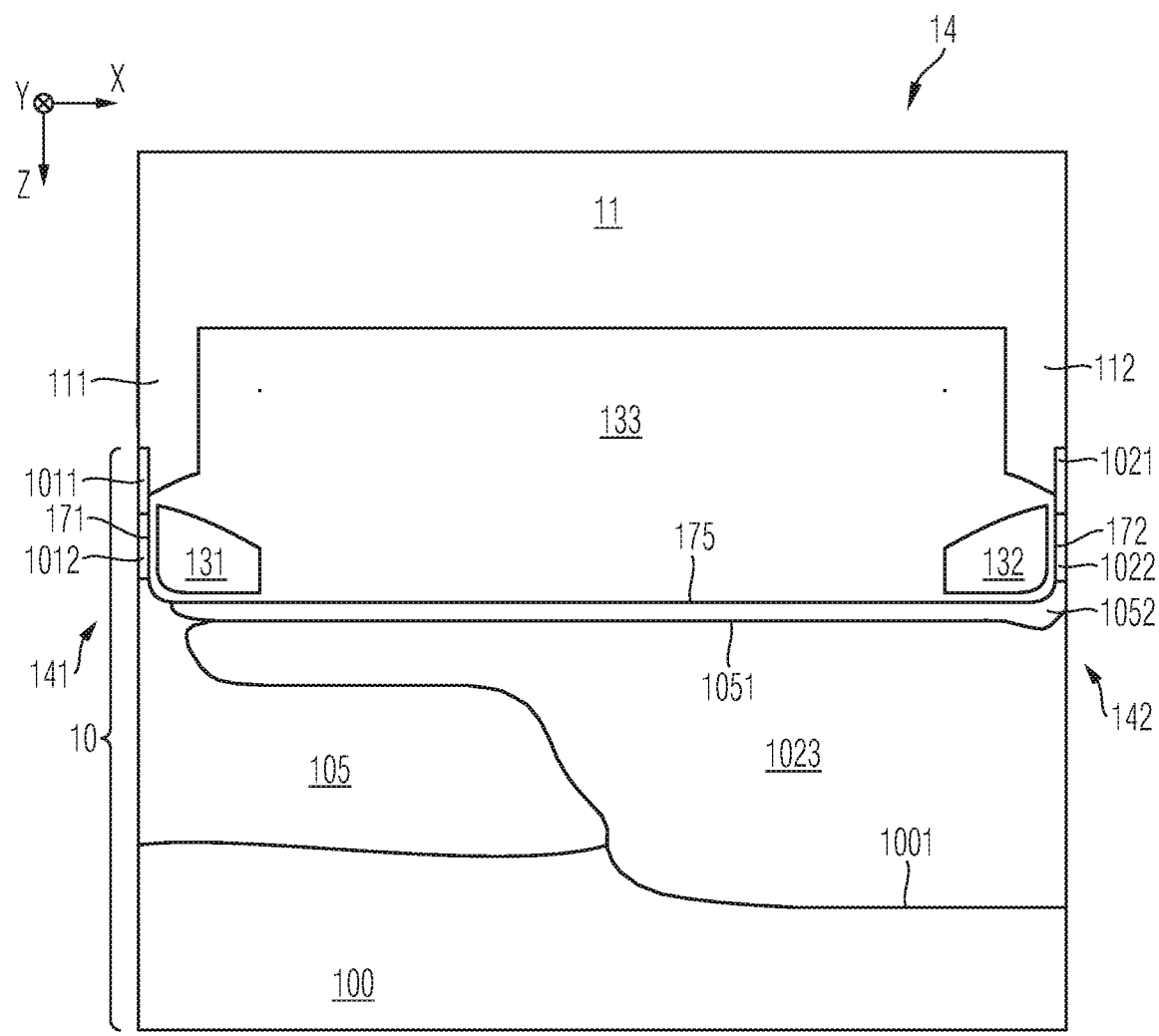

IGBT WITH FULLY DEPLETABLE N- AND P-CHANNEL REGIONS

PRIORITY CLAIM

This application claims priority to German Application No. 10 2017 130 092.9 filed Dec. 15, 2017. The entire contents of the above identified prior filed applications are hereby entirely incorporated herein by reference.

TECHNICAL FIELD

This specification refers to embodiments of a power semiconductor device and to embodiments of a method of processing a power semiconductor device. In particular, this specification refers to embodiments of an IGBT with fully depletable n- and p-channel regions and to embodiments of a corresponding processing method.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

It is a general aim to keep losses occurring in semiconductor devices low, wherein said losses essentially are caused by conducting losses and/or switching losses.

For example, a power semiconductor device comprises a plurality of MOS control heads, wherein each control head may have at least one control electrode and a source region and a channel region arranged adjacent thereto.

For setting the power semiconductor device into a conducting state, during which a load current in a forward direction may be conducted, the control electrode may be provided with a control signal having a voltage within a first range so as to induce a load current path within the channel region.

For setting the power semiconductor device into a blocking state, during which a forward voltage applied to load terminals of the semiconductor device may be blocked and flow of the load current in the forward direction is inhibited, the control electrode may be provided with the control signal having a voltage within a second range different from the first range so as to cut off the load current path in the channel region. Then, the forward voltage may induce a depletion region at a junction formed by a transition between the channel region and a drift region of the power semiconductor device, wherein the depletion region is also called "space charge region" and may mainly expand into the drift region of the semiconductor device. In this context, the channel region is frequently also referred to as a "body region," in which said load current path, e.g., an inversion channel, may be induced by the control signal to set the semiconductor device in the conducting state. Without the load current path in the channel region, the channel region may form a blocking junction with the drift region.

To keep losses of the power semiconductor device low, a charge carrier density within a semiconductor body of the power semiconductor device may need to be controlled in an appropriate manner.

Further, whereas high switching speeds may yield low losses, some applications may require that the rate of change of the load current and/or the voltage over time within the power semiconductor device, such as a rate of change of the voltage during a turn-on or turn-off operation (also referred to as "dU/dt" or, respectively, "dV/dt"), do not exceed a predetermined maximum.

Hence, it can be desirable to provide a power semiconductor device that offers low conduction losses and low switching losses and at the time an easy controllability so as to ensure that a rate of change of the voltage during a turn-on or a turn-off operation does not exceed a predetermined maximum.

SUMMARY

According to an embodiment, a power semiconductor device has a semiconductor body coupled to a first load terminal structure and a second load terminal structure, the semiconductor body comprising a drift region of a first conductivity type and being configured to conduct a load current during a conducting state of the power semiconductor device and to block a load current during a blocking state of the power semiconductor device, wherein the power semiconductor device includes a plurality of cells. Each cell comprises: a first mesa included in a first cell portion, the first mesa including: a first port region of the first conductivity type being electrically connected to the first load terminal structure, and a first channel region being coupled to the drift region, wherein the first mesa exhibits a total extension of less than 100 nm in a lateral direction perpendicular to a vertical direction of the load current part within the first mesa; a second mesa included in a second cell portion, the second mesa including: a second port region of a second conductivity type and being electrically connected to the first load terminal structure, and a second channel region being coupled to the drift region; a trench structure including a control electrode structure for controlling the load current; wherein the first cell portion is configured to fully deplete the first channel region of mobile charge carriers of the second conductivity type in the conducting state; and wherein the first cell portion is configured to induce a current path for mobile charge carriers of the first conductivity type in the first channel region in the conducting state and no current path for mobile charge carriers of the first conductivity type in the blocking state; and a guidance zone of the second conductivity type arranged below the second channel region and being spatially displaced from both first and the second channel region along the vertical direction, wherein the guidance zone laterally overlaps with the second mesa and laterally extends towards the first mesa without laterally overlapping therewith in the lateral direction.

According to another embodiment, a power semiconductor device has a semiconductor body coupled to a first load terminal structure and a second load terminal structure, the semiconductor body being configured to conduct a load current and comprising a drift region of a first conductivity type, wherein the power semiconductor device includes a plurality of cells. Each cell comprises: a first mesa included in a first cell portion, the first mesa including: a first port region of the first conductivity type being electrically connected to the first load terminal structure, and a first channel region being coupled to the drift region; a second mesa included in a second cell portion, the second mesa including: a second port region of a second conductivity type and being electrically connected to the first load terminal structure, and a second channel region being coupled to the drift region; a trench structure including a control electrode structure for controlling the load current at least by means of a conductive channel for mobile charge carriers of the first conductivity type in the first channel region; a guidance zone of the second conductivity type arranged below the second channel region, wherein the guidance zone laterally overlaps with the second mesa and laterally extends towards the first mesa while not laterally overlapping therewith in a lateral direction; a barrier zone of the first conductivity type being arranged between the guidance zone and the trench structure, wherein the barrier zone has a dopant concentration at least twice as great as the dopant concentration of the drift region.

According to a yet further embodiment, a method of processing a power semiconductor device is presented. The power semiconductor device has a semiconductor body coupled to a first load terminal structure and a second load terminal structure, the semiconductor body being configured to conduct a load current and comprising a drift region of a first conductivity type, wherein the power semiconductor device includes a plurality of cells. Each cell comprising: a first mesa included in a first cell portion, the first mesa including: a first port region of the first conductivity type being electrically connected to the first load terminal structure, and a first channel region being coupled to the drift region; a second mesa included in a second cell portion, the second mesa including: a second port region of a second conductivity type and being electrically connected to the first load terminal structure, and a second channel region being coupled to the drift region; a trench structure including a control electrode structure for controlling the load current at least by means of a conductive channel for mobile charge carriers of the first conductivity type in the first channel region. The method comprises at least one of a) providing the first mesa with a total extension of less than 100 nm in a lateral direction perpendicular to a vertical direction of the load current part within the first mesa; and providing a guidance zone of the second conductivity type arranged below the second channel region while being spatially displaced from both the first and the second channel region along the vertical direction, wherein the guidance zone laterally overlaps with the second mesa and laterally extends towards the first mesa while not laterally overlapping therewith in the lateral direction;

b) providing a guidance zone of the second conductivity type arranged below the second channel region, wherein the guidance zone laterally overlaps with the second mesa and laterally extends towards the first mesa while not laterally overlapping therewith in the lateral direction; and providing a barrier zone of the first conductivity type being arranged between the guidance zone and the trench structure, wherein the barrier zone has a dopant concentration at least twice as great as the dopant concentration of the drift region.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is placed upon illustrating principles of the invention. Moreover, in the figures, like reference numerals designate corresponding parts. In the drawings:

FIGS. 8A-8D each schematically illustrate a section of a vertical cross-section of a power semiconductor device in accordance with some embodiments; and FIGS. 9, 10, 11A-11B, and 12-17 each schematically illustrate a section of a vertical cross-section of a power semiconductor device in accordance with some embodiments.

DETAILED DESCRIPTION

Figure 1A:
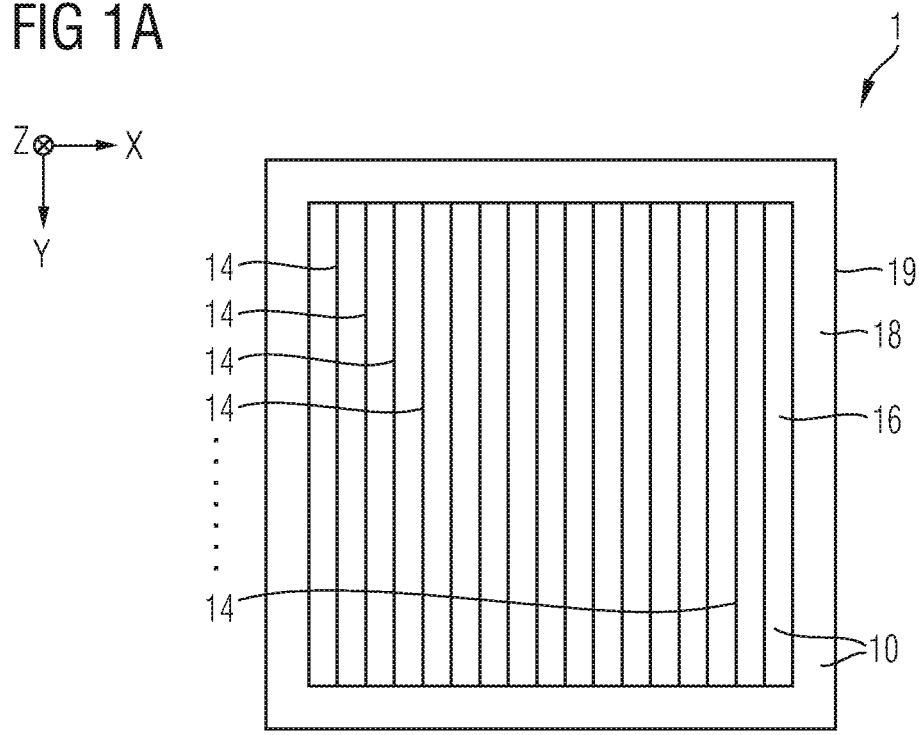
FIGS. 1A-1B each schematically illustrate a section of a horizontal projection of a power semiconductor device in accordance with some embodiments.

In the following detailed description, reference is made to the accompanying drawings which form a part hereof and in which are shown by way of illustration specific embodiments in which the invention may be practiced.

In the following detailed description, reference is made to the accompanying drawings which form a part hereof and in which are shown by way of illustration specific embodiments in which the invention may be practiced.

In this regard, directional terminology, such as "top," "bottom," "below," "front," "behind," "back," "leading," "trailing," "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification may describe an orientation substantially parallel to a horizontal surface of a semiconductor substrate or of a semiconductor region, such as the semiconductor body mentioned below. This can be for instance the surface of a semiconductor wafer or a die. For example, both the first lateral direction X and the second lateral direction Y mentioned below may be horizontal directions, wherein the first lateral direction X and the second lateral direction Y may be perpendicular to each other.

The term "vertical" as used in this specification may describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y. Hence, the extension direction Z will herein also be referred to as vertical direction Z.

However, it shall be understood the embodiments of power semiconductor devices described below may exhibit a lateral configuration or a vertical configuration.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region/zone/section/layer. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

The term "power semiconductor device" as used in this specification intends to describe a semiconductor device on a single chip with high voltage blocking and/or high current-carrying capabilities. In other words, such power semiconductor device is configured for a high load current, typically in the Ampere range, e.g., up to several ten or hundred Ampere, and/or high voltages, typically above 5 V, or above 15 V or more typically 400V and, e.g., up to some 1000 Volts.

For example, the term "power semiconductor device" as used in this specification is not directed to logic semiconductor devices that are used for, e.g., storing data, computing data and/or other types of semiconductor based data processing.

Specific embodiments described in this specification thus pertain to, without being limited thereto, a power semiconductor device (in the following simply also referred to as "semiconductor device" or "device") that may be used within a power converter or a power supply, e.g., for converting a first power signal into a second power signal different from the first power signal. For example, to this end, the power semiconductor device may comprise one or more power semiconductor cells, such as a monolithically integrated transistor cell, a monolithically integrated diode cell, and/or a monolithically integrated IGBT cell, and/or a monolithically integrated MOS Gated Diode (MGD) cell, and/or a monolithically integrated MOSFET cell and/or derivatives thereof. Such diode cells and/or such transistor cells may be integrated in a semiconductor chip, wherein a number of such chips may be integrated in a power semiconductor module, such as an IGBT module.

In accordance with all embodiments described herein, the power semiconductor device may have an IGBT configuration.

Figure 1B:
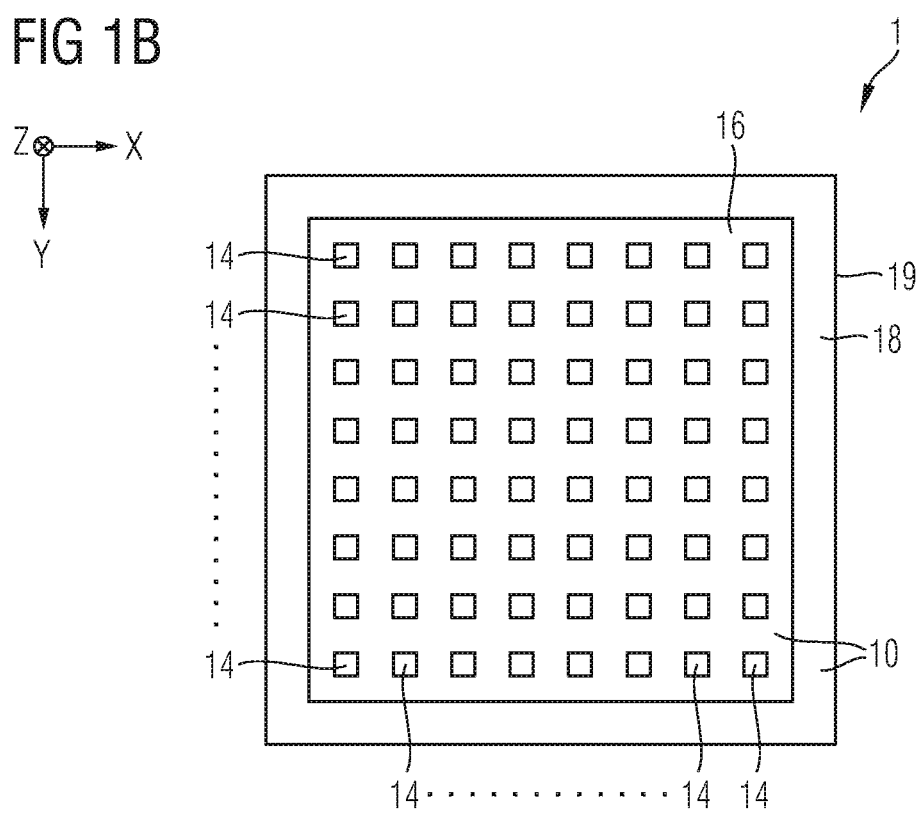

FIG. 1A schematically and exemplarily illustrates a section of a horizontal projection of a power semiconductor device 1 in accordance with one or more embodiments. Also FIG. 1B schematically and exemplarily illustrates a section of a horizontal projection of a power semiconductor device 1 in accordance with one or more other embodiments. In both of FIG. 1A and FIG. 1B, the horizontal projection may be in parallel to the plane defined by the first lateral direction X and the second lateral direction Y. The components of the semiconductor device 1 may each extend along the extension direction Z that may be perpendicular to each of the first lateral direction X and the second lateral direction Y.

The semiconductor device 1 may comprise an active cell field 16 that includes one or more active cells 14, e.g., MOS (Metal Oxide Semiconductor) cells, in the following simply referred to as "cells" 14. The number of cells 14 is greater than, e.g., one hundred or even greater than one thousand or more. For example, the semiconductor device 1 may comprise the active cell field 16 with a cell field area of 1 mm*1 mm, or larger, and, e.g., there may be included about 200 to 1000 cells 14 within such cell field area, e.g., at a cell pitch of 1 to 5 μm. The active cell field 16 may be configured to conduct a total load current, wherein the total load current may be greater than 1 A, greater than 10 A or even greater than 100 A. In the following, said total load current is also simply referred to as "load current".

The active cell field 16 may be surrounded by an edge termination zone 18 of the semiconductor device 1. For example, the edge termination zone 18 does not include any active cells. The edge termination zone 18 may be terminated by an edge 19, which may have come into being, e.g., by dicing a chip out of a wafer.

Further, the active cell field 16 or, respectively, the active cell field 16 and the edge termination zone 18 may be configured to block a voltage of at least 20 V, of at least 100 V, of at least 400 V, or of at least 1000 V.

As schematically illustrated in FIG. 1A, the cells 14 may exhibit a stripe configuration. Accordingly, each of the cells 14 and at least some of the components which they may comprise may extend along substantially the entire active cell field 16 along one of the first lateral direction X and the second lateral direction Y (as illustrated), e.g., bordering a transition region between the active cell field 16 and the edge termination zone 18.

In another embodiment that is schematically illustrated in FIG. 1B, the cells 14 may exhibit a needle configuration (also referred to as "columnar configuration") whose total lateral extensions along each of the first lateral direction X and the second lateral direction Y amount to only a fraction of the total lateral extensions along the first lateral direction X and the second lateral direction Y of the active cell field 16. For example, the total lateral extension of a respective needle cell amounts to less than 1% of the total extension of the active cell field 16 along one of the first lateral direction X and the second lateral direction Y. Further optional aspects of a needle cell and a stripe cell will be explained further below.

In another embodiment, the active cell field 16 may comprise both types of cells 14, e.g., one or more cells 14 with a stripe configuration and one or more cells 14 with a needle configuration or, e.g., one or more cells 14 with stripe configurations with different dimensions in the second lateral direction Y.

Both the active cell field 16 and the edge termination zone 18 may at least partially be formed within a joint semiconductor body 10 of the device 1. The semiconductor body 10 may be configured to carry the total load current that may be controlled, e.g., by means of the cells 14, as will be explained in more detail below.

In an embodiment, the semiconductor device 1 is a bipolar power semiconductor device 1. Thus, the total load current within the semiconductor body 10 may be constituted by a first load current formed by first charge carriers of the first conductivity type and by a second load current formed by second charge carriers of the second conductivity type complimentary to the first conductivity type. For example, the first charge carriers are electrons and the second charge carriers are holes.

Figure 2A:
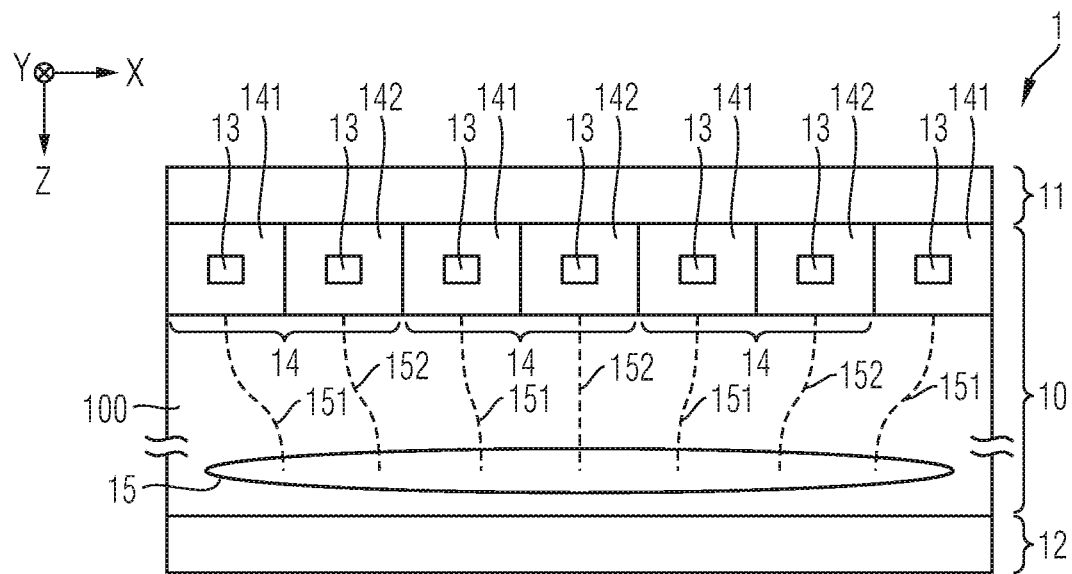
FIGS. 2A-2B each schematically illustrate a section of a vertical cross-section of a power semiconductor device in accordance with one or more embodiments.
Figure 2B:
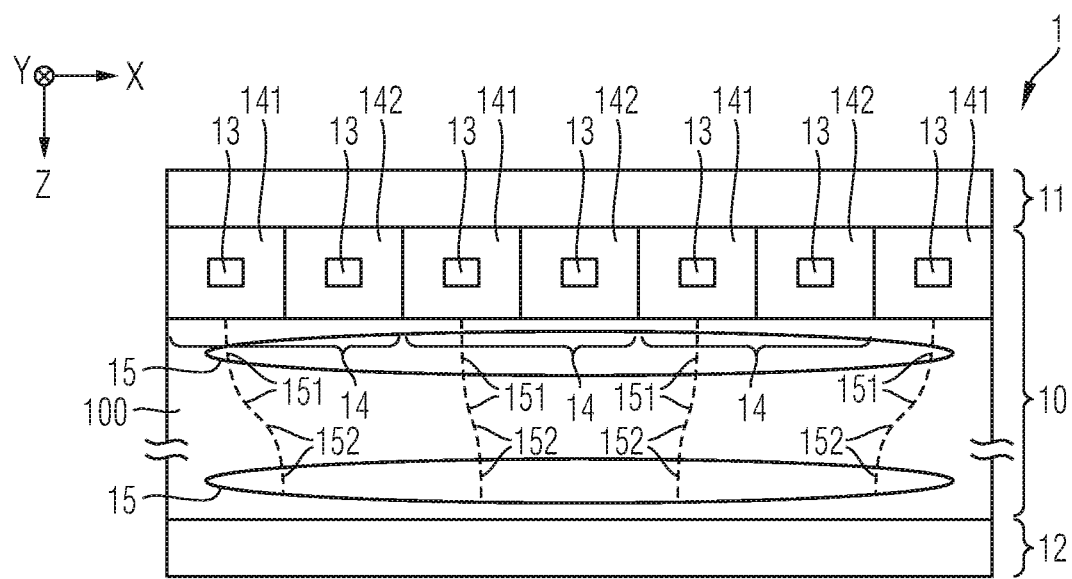

Regarding now FIG. 2A, which schematically and exemplarily illustrates a section of a vertical cross-section of the semiconductor device 1 in accordance with one or more embodiments, the semiconductor device 1 may further comprise a first load terminal structure 11 and a second load terminal structure 12. For example, the first load terminal structure 11 is arranged separately from the second load terminal structure 12. The semiconductor body 10 may be coupled to each of the first load terminal structure 11 and the second load terminal structure 12 and may be configured to receive the total load current 15 (also referred to as "load current")) via the first load terminal structure 11 and to output the total load current 15 via the second load terminal structure 12 and/or vice versa.

The semiconductor device 1 may exhibit a vertical set-up, according to which, for example, the first load terminal structure 11 is arranged at a front side of the semiconductor device 1 and the second load terminal structure 12 is arranged at a back side of the semiconductor device 1. In another embodiment, the semiconductor device 1 may exhibit a lateral set-up, according to which, e.g., both the first load terminal structure 11 and the second load terminal structure 12 are arranged on the same side of the semiconductor device 1.

For example, the first load terminal structure 11 comprises a first metallization, e.g., a front side metallization, and the second load terminal structure 12 may comprise a second metallization, e.g., a back side metallization. Further, one or both of the first load terminal structure 11 and the second load terminal structure may comprise a diffusion barrier (not illustrated).

Within the present specification, the direction of the total load current 15 is expressed in the conventional manner, i.e., as a flow direction of positive charge carriers such as holes and/or as direction opposite to a flow of negative charge carriers such as electrons. A forward direction of the total load current 15 may point, for example, from the second load terminal structure 12 to the first load terminal structure 11.

As has been explained above, the total load current 15 may comprise a movement of charge carriers of the first conductivity type, e.g., an electron movement or an electron current, and a movement of charge carriers of the second conductivity type, e.g., a hole movement or a hole current. Thus, the direction of the movement of charge carriers of the second conductivity type may be in parallel to the technical (conventional) direction of the total load current 15, whereas the direction of the movement of charge carriers of the first conductivity type may be anti-parallel to the direction of the load current 15. The sum of a charge movement of the first conductivity type and the second conductivity type may form the total load current 15 conducted by the semiconductor body 10.

A first charge carrier of the first conductivity type, e.g., an electron, moving from the first load terminal structure 11 towards the second load terminal structure 12 or vice versa may recombine with a second charge carrier of the complementary type, e.g., of the second conductivity type, e.g., a hole, on its way through the semiconductor body 10. For example in the vicinity of the first load terminal structure 11, the total load current 15 in the forward direction may largely or even entirely consist of movement of charge carriers of the first conductivity type (e.g., electrons) moving towards the second load terminal structure 12, wherein, in the vicinity of the second load terminal structure 12 (cf. third port region 104), the total load current 15 in the forward direction may mostly or even entirely consist of movement of charge carriers of a second conductivity type (e.g., holes) moving towards the first load terminal structure 11. The electrons and holes may recombine inside the semiconductor body 10. However, within a drift region 100 of the semiconductor body 10, there may occur substantially no or only little recombination, according to one or more embodiments. According to an embodiment, an ambipolar lifetime of the first and second charge carrier type, i.e., the time until the density of carriers is reduced to a value of $1/e \approx 37\%$ of their initial value, is more than e.g., 1 μs, more than 10 μs, more than 30 μs or more than 70 μs.

Further, the movement of charge carriers of the first conductivity type may comprise or consist of a first drift movement, e.g., an electron drift movement, and a first diffusion movement, e.g., an electron diffusion movement. Simplified, the total movement of charge carriers of the first conductivity type will result in a first load current 151.

Also, the movement of charge carriers of the second conductivity type may comprise or consist of a second drift movement, e.g., a hole drift movement, and a second diffusion movement, e.g., a hole diffusion movement. In an analogue definition, the total movement of charge carriers of the second conductivity type will result in a second load current 152.

Thus, in the conducting state of the semiconductor device 1, the total load current 15 can be conducted by the semiconductor body 10, wherein at each cross-section through the semiconductor body 10 separating the first load contact structure 11 from the second load contact structure 12, the total load current 15 can be composed of the first load current 151 flowing through said cross-section, which may be an electron current, and the second load current 152 flowing through said cross-section, which may be a hole current. At each cross-section, the sum of amounts of the first load current 151 and the second load current 152 may equal the amount of the total load current 15, wherein said cross-sections may be perpendicular to the direction of the total load current 15. For example, during the conducting state, the total load current 15 may be dominated by the first load current 151, i.e., the first load current 151 may be substantially greater than the second load current 152, e.g., amounting to more than 75%, more than 80%, or even more than 90% of the total load current. During a transition from the blocking state to the conducting state or during a transition from the conducting state to the blocking state, i.e., during switching, the second load current 152 may represent a higher portion of the total load current 15, i.e., the second load current 152 may be even greater than the first load current 151.

For controlling the total load current 15, the semiconductor device 1 may further comprise a control electrode structure 13. For example, the semiconductor device 1 may be configured to be set into one of the blocking state and the conducting state by means of the control electrode structure 13.

In an embodiment, for setting the semiconductor device 1 into a conducting state during which the total load current 15 in the forward direction may be conducted, the control electrode structure 13 may be provided with a control signal having a voltage within a first range. For setting the semiconductor device 1 into a blocking state during which a forward voltage may be blocked and flow of the load current 15 in the forward direction is avoided, the control electrode structure 13 may be provided with the control signal having a voltage within a second range different from the first range.

In an embodiment, the control signal may be provided by applying a voltage between the control electrode structure 13 and the first load terminal structure 11 and/or by applying a voltage between the control electrode structure 13 and the second load terminal structure 12.

For example, the control electrode structure 13 may at least partially be implemented within the cells 14, as schematically illustrated in FIGS. 2A-3B. Further, the cells 14 may at least partially be implemented within the semiconductor body 10. The cells 14 may form a part of the semiconductor body 10.

In an embodiment, the cells 14 may comprise at least one first cell portion 141 and at least one second cell portion 142. The second cell portion 142 may be different and arranged separately from the first cell portion 141.

Each of the first cell portion 141 and the second cell portion 142 may be electrically connected to the first load terminal structure 11 on one side and may be electrically coupled to the semiconductor drift region 100 (herein also simply referred to as "drift region") of the semiconductor body 10 on another side.

The drift region 100 is a region of the first conductivity type. For example, the drift region 100 exhibits a concentration of dopants of the first conductivity type within the range of $10^{12}$ cm$^{-3}$ to $10^{18}$ cm$^{-3}$, e.g., $10^{13}$ cm$^{-3}$ to $10^{15}$ cm$^{-3}$, e.g., within in the range of $2*10^{13}$ cm$^{-3}$ to $2*10^{14}$ cm$^{-3}$. The drift region 100 may further comprise dopants of the second conductivity type. For example, the comparatively high dopant concentrations may be applicable if the semiconductor device 1 exhibits a compensation structure (also referred to as superjunction structure). In this case, locally high concentrations of dopants of the first and the second conductivity type may occur. However, when integrating the first and second doping concentrations in the drift region 100 in, e.g., a horizontal plane, e.g., substantially parallel to the first load terminal structure 11 or the second load terminal structure 12, the resulting integrated dopant concentration can be significantly lower, at least e.g., by a factor of 3, or a factor of 5, or a factor of 10 than the larger of the individual dopant concentration of the first and/or second conductivity type. Such locally high dopant concentration may be supportive for draining charge carriers out of the semiconductor body 10, e.g., during turn-off, and may thus lead to reduced turn-off losses and/or faster turn-off.

In an embodiment, the first cell portion 141 is configured to control the first load current 151 and the second cell portion 142 is configured to control the second load current 152. For example, the first cell portion 141 is configured to prevent the second load current 152 from traversing the first cell portion 141. Further, the second cell portion 142 can be configured to prevent the second load current 152 from traversing the second cell portion 152, e.g., if the semiconductor device 1 is in a conducting state.

The first cell portion 141 may thus be a unipolar cell configured to control charge carriers of the first conductivity type and the second cell portion 142 may be a unipolar cell configured to control charge carriers of the second conductivity type.

In an embodiment, the semiconductor device 1 may be configured to split the total load current 15 conducted by the semiconductor body 10 into the first load current 151 and into the second load current 152 by means of the first cell portion 141 and the second cell portion 142 that may form an interface between the first load terminal structure 11 and a part of the semiconductor body 10, e.g., said drift region 100. Thus, in the path of the total load current 15 between the drift region 100 of the semiconductor body 10 and the first load terminal structure 11, the first load current 151 may traverse the first cell portion 141, e.g., if the semiconductor device 1 is in a conducting state, and, e.g., if the semiconductor device 1 is switched from the conducting state to the blocking state, the second load current 152 may traverse the second cell portion 142, as will be explained in more detail below.

Figure 3A:
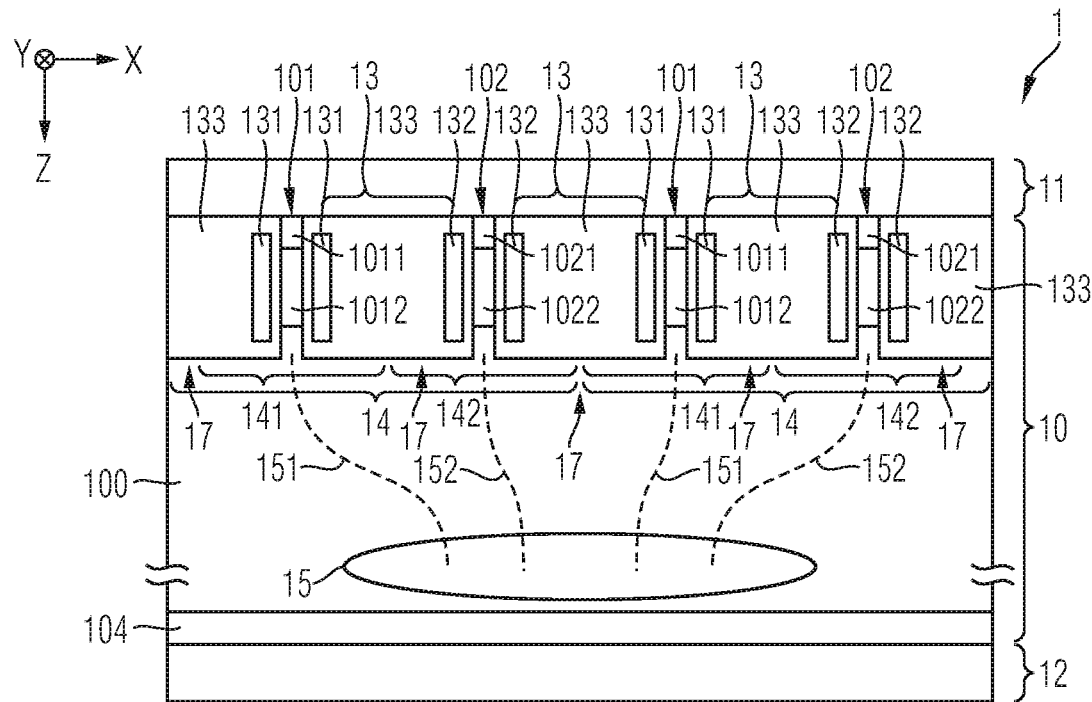
FIGS. 3A-3B each schematically illustrate a section of a vertical cross-section of a power semiconductor device in accordance with one or more embodiments.
Figure 3B:
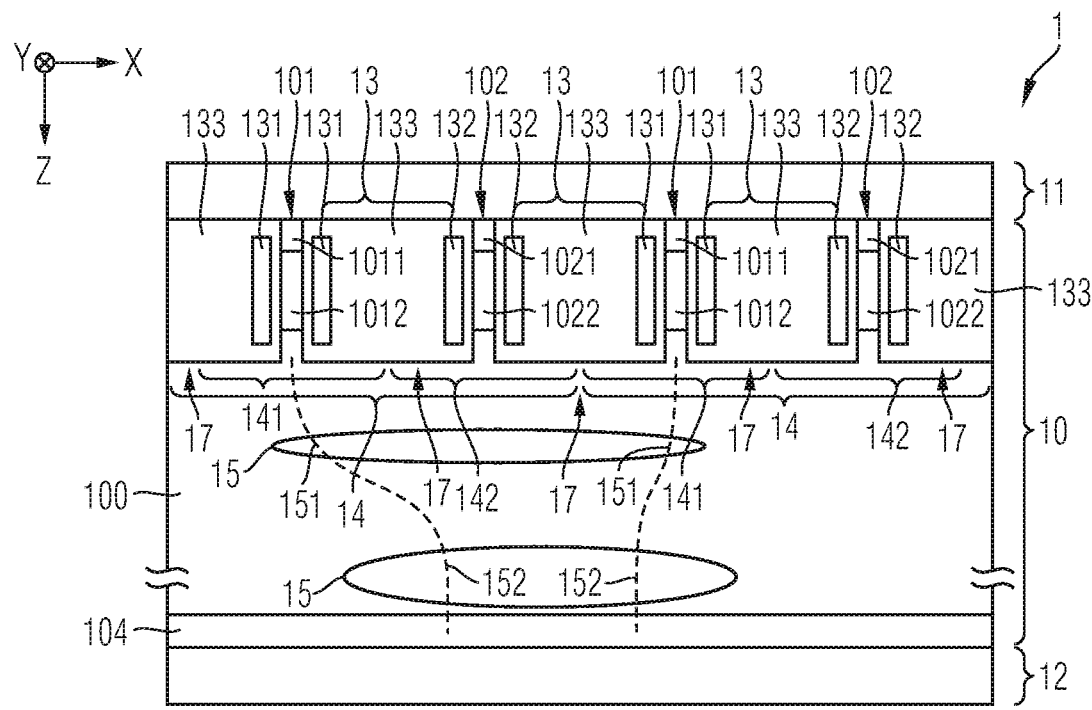

With respect to FIGS. 3A and 3B, exemplary aspects of the cells 14 shall be explained.

FIGS. 3A and 3B schematically and exemplarily illustrate sections of a vertical cross-section of the semiconductor device 1 in accordance with one or more embodiments. The general configuration of the semiconductor device 1 in accordance with the embodiment of FIGS. 3A-B may be identical or similar to the general configuration of the semiconductor device 1 in accordance with the embodiments of FIGS. 1A, 1B and 2A, 2B. Thus, what has been stated above with respect to FIGS. 1A to 2B may equally apply to the embodiment of FIGS. 3A and 3B, if not stated otherwise.

In an embodiment, the control signal provided to the control electrode structure 13 comprises a first control signal and a second control signal. The first control signal may be provided for controlling the first cell portion 141 and the second control signal may be provided for controlling the second cell portion 142. In an embodiment, first control signal is identical to the second control signal. In another embodiment, the first control signal is different from second control signal. The control signal may be provided from external of the semiconductor device 1, e.g., by a driver (not illustrated) configured to generate the first control signal and the second control signal. In another embodiment, one or both of the first control signal and second control signal may be generated or provided by an internal signal or by an internal potential of the semiconductor device 1.

The control electrode structure 13 may be included within a trench structure 17. Further, the control electrode structure 13 may comprise one or more first control electrodes 131 and/or one or more second control electrodes 132. For example, each of the one or more first control electrodes 131 and/or one or more second control electrodes 132 are trench electrodes, as illustrated in FIGS. 3A-B.

The first cell portion 141 may comprise one or more of the first control electrodes 131 that can be configured to receive the first control signal. The first control electrodes 131 may be insulated from the semiconductor body 10 by means of an insulation structure 133. The insulation structure 133 may form the trench structure 17.

The second cell portion 142 may comprise one or more of the second control electrodes 132 that can be configured to receive the second control signal. The second control electrodes 132 may also be insulated from the semiconductor body 10 by means of the insulation structure 133.

The material and the dimensions of the one or more first control electrodes 131 may be identical to the material and the dimensions of the one or more second control electrodes 132 or different therefrom.

Further, already at this point, it shall be understood that in contrast to the exemplary schematic representations in FIGS. 3A, 3B, 5A, 8A-D, 11, 13 and 17 the control electrodes 131 and 132 may also be arranged in contact with each other in accordance with one or more embodiments, thereby forming a monolithic control electrode used for controlling each of the first cell portion 141 and the second cell portion 142. In other words, in an embodiment, the control electrodes 131 and 132 can be respective sections of one joint control electrode (cf. FIGS. 6, 7, 9, 10, 12, 13 (cf. dashed line), 15 and 16).

The insulation structure 133 may thus house the control electrode structure 13. Further, one, more or each of the first control electrode(s) 131 and the second control electrode(s) 132 may be electrically insulated from both the first load terminal structure 11 and the second load terminal structure 12.

In an embodiment, the first cell portion 141 includes a first mesa 101 at least partially implemented as a part of the semiconductor body 10. Also, the second cell portion 142 may include a second mesa 102 that is at least partially implemented as a part of the semiconductor body 10. For example, both the first mesa 101 and the second mesa 102 are electrically connected to the first load terminal structure 11. The second mesa 102 can be different and arranged separately from the first mesa 101.

The first mesa 101 and the second mesa 102 may be spatially confined by the insulation structure 133. Exemplary specifications of the spatial dimensions of the mesa 101 and 102 and their components will be described with respect to FIG. 5. At the same time, the insulation structure 133 may house the first control electrode(s) 131 and the second control electrode(s) 132.

The first mesa 101 may include a first port region 1011 electrically connected to the first load terminal structure 11. The first port region 1011 may be a first semiconductor port region. For example, the first port region 1011 is of the first conductivity type and, e.g., comprises dopants of the first conductivity type at a dopant concentration in the range of $10^{19}$ cm$^{-3}$ to $10^{22}$ cm$^{-3}$, e.g., $10^{20}$ cm$^{-3}$ to $5*10^{21}$ cm$^{-3}$. For example, the first port region 1011 is an n-region. Thus, a dopant concentration of the first port region 1011 may be at least two orders of magnitude (corresponding to a factor of 100) greater than the dopant concentration of the drift region 100. In an embodiment, the first port region 1011 is a doped semiconductor region that has additionally been silicided. For example, a silicide is provided in the first port region 1011. Further, such silicided first port region 1011 may exhibit a common extension range along the vertical direction Z with the first control electrode 131. For example, such silicided first port region 1011 could also be referred to as "metal source". At a transition from the silicided first port region 1011 to a first channel region 1012 (explained in more detail below) of the first mesa 101, a doping spike may be present, e.g., an n*-doping spike.

The second mesa 102 may include a second port region 1021 electrically connected to the first load terminal structure 11. The second port region 1021 may be a second semiconductor port region. For example, the second port region 1021 is of the second conductivity type and, e.g., comprises dopants of the second conductivity type at a dopant concentration in the range of $10^{18}$ cm$^{-3}$ to $10^{22}$ cm$^{-3}$, e.g., $10^{19}$ cm$^{-3}$ to $10^{21}$ cm$^{-3}$. For example, the second port region 1021 is a p$^+$-region. Thus, a dopant concentration of the second port region 1021 may be at least two orders of magnitude greater than the dopant concentration of the drift region 100. In an embodiment, the second port region 1021 is a doped semiconductor region that has additionally been silicided. For example, a silicide is provided in the second port region 1021. Further, such silicided second port region 1021 may exhibit a common extension range along the vertical direction Z with the second control electrode 132. At a transition from the silicided second port region 1021 to a second channel region 1022 (explained in more detail below) of the second mesa 102, a doping spike may be present, e.g., a p$^+$-doping spike.

The first mesa 101 may further include a first channel region 1012 in contact with the first port region 1011. The first channel region 1012 may be a first semiconductor channel region. For example, the first channel region 1012 of the second conductivity type and, e.g., comprises dopants of the second conductivity type at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$. For example, the first channel region 1012 is a p-region or a p$^-$-region. In another embodiment, the first channel region 1012 comprises dopants of the first conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{13}$ cm- to $10^{17}$ cm$^{-3}$.

For example, the first channel region 1012 may be coupled to the semiconductor drift region 100.

In an embodiment, at least the first channel region 1012 may separate the first port region 1011 from the semiconductor drift region 100. Further, the first channel region 1012 may be an electrically floating region. For example, the first channel region 1012 is not in contact with the first load terminal structure 11 but separated therefrom by means of the first port region 1011. In another embodiment, the first channel region 1012 is electrically connected to the first load terminal structure 11.

The second mesa 102 may further include a second channel region 1022 in contact with the second port region 1021. The second channel region 1022 may be a second semiconductor channel region. For example, the second channel region 1022 is of the second conductivity type and, e.g., comprises dopants of the second conductivity type at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$. For example, the second channel region 1022 is a p-region. In another embodiment, the second channel region 1022 comprises dopants of the first conductivity type, e.g., at a dopant concentration in the range of up to $10^{19}$ cm$^{-3}$, e.g., $10^{11}$ cm$^{-3}$ to $10^{18}$ cm$^4$, e.g., in the range of $10^{13}$ cm$^{-3}$ to $10^{17}$ cm$^{-3}$.

For example, the second channel region 1022 may be coupled to the semiconductor drift region 100.

Further, at least the second channel region 1022 may separate the second port region 1021 from the semiconductor drift region 100. Further, the second channel region 1022 may be an electrically floating region, wherein the second channel region 1022 may be coupled to the drift region 100 (e.g., by means of a barrier zone 105 mentioned further below) or may even be in contact with the drift region 100. For example, the second channel region 1022 is not in contact with the first load terminal structure 11 but separated therefrom by means of the second port region 1021. In another example, the second channel region 1022 may be of the same conductivity type as the second port region 1021 and the second channel region 1022 is only temporarily rendered into an insulating or floating state by applying a suitable work function of the material of the second control electrode 132 or a suitable electrical potential to the second control electrode 132.

The first mesa 101 can be a first semiconductor mesa and the second mesa 102 can be a second semiconductor mesa. It shall be understood that along the second lateral direction Y, the first mesa 101 may turn into the second mesa 102 (or the third mesa 103 mentioned further below) and vice versa; i.e., along the second lateral direction Y, the mesa may change its configuration. At a transition between the active cell field and the edge termination zone 18, means for electrically contacting the mesa (irrespective of its type (101, 102 or 103) may be omitted.

In an embodiment, one of or both the first port region 1011 and the second port region 1022 may comprise a metal.

For example, the first port region 1011 amounts to a certain portion of the total volume of the first mesa 101, e.g., within the range of up to 75%, e.g., 10% to 75%, e.g., in the range of 20% to 50%. The first channel region 1012 may amount to another portion of the total volume of the first mesa 101, e.g., within the range of 10% to 90%, e.g., 25% to 90%. e.g., in the range of 25% to 75%.

The second port region 1021 may amount to a certain portion of the total volume of the second mesa 102, e.g., within the range of up to 75%, e.g., 10% to 75%, e.g., in the range of 20% to 50%. The second channel region 1022 may amount to another portion of the total volume of the second mesa 102, e.g., within the range of 10% to 90%, e.g., 25% to 90%, e.g., in the range of 25% to 75%.

In an embodiment, the first cell portion 141 including the first mesa 101 is configured to fully deplete the first channel region 1012 of mobile charge carriers of the second conductivity type in the conducting state of the semiconductor device 1.

Further, the second cell portion 142 including the second mesa 102 may be configured to fully deplete the second channel region 1022 of mobile charge carriers of the second conductivity type in the conducting state of the semiconductor device 1.

In the conducting state, as exemplarily illustrated in FIG. 3B, the semiconductor device 1 may be configured to split the path of total load current 15 into at least two separate paths, the first one of which is taken by the first load current 151 and traversing the first mesa 101 including the first channel region 1012 that is fully depleted of mobile charge carriers of the second conductivity type, and the second one of which is taken by the second load current 152 and does neither traverse the second mesa 102 including the second channel region 1022 that may be fully depleted of mobile charge carriers of the second conductivity type nor the first mesa 101 including the first channel region 1012 that may also be fully depleted of mobile charge carriers of the second conductivity type. Rather, the second cell portion 142 may be configured to block flow of the second load current 152 through the second mesa 102, thereby avoiding that mobile charge carriers of the second conductivity type leave the semiconductor body 10 during the conducting state of the semiconductor device 1. In other words, during the conducting state, the magnitude of the second load current 152 within each of the first mesa 101 and the second mesa 102 according to one embodiment may amount to substantially zero. According to another embodiment, a certain portion of the load current of up to 30% or up to 20% or up to 10% may be conducted by the second load current 152 which may traverse at least one of the first mesa 101 and second mesa 102.

In the following, the term "fully depleted channel region" intends to describe a channel region that is fully or at least predominantly depleted of mobile charge carriers of the second conductivity type, wherein mobile charge carriers of the first conductivity type may still be present to a substantial extent in the fully depleted channel region. The same definition applies to the term "fully depletable channel region".

For example, in the stationary conducting operating state, the fully depleted first channel region 1012 does not include any or hardly any mobile charge carriers of the second conductivity type or at least no mobile charge carrier density of the second conductivity type above a leakage current level, or at least an average mobile charge carrier density of the second conductivity type which is below 10% of the average mobile charge carrier density of the first conductivity type in the first channel region 1012.

Further, in an embodiment, e.g., in the stationary blocking operating state, the fully depleted second channel region 1022 does not include any or hardly any mobile charge carriers of the first conductivity type or at least no mobile charge carrier density of the first conductivity type above a leakage current level, or at least an average mobile charge carrier density of the first conductivity type which is below 10% of the average mobile charge carrier density of the second conductivity type in the second channel region 1022.

Thus, in accordance with an embodiment, the channel regions 1012 and 1022 are fully depleted regions in a conducting state of the semiconductor device 1.

For example, the channel regions 1012 and 1022 are fully depleted. This can be achieved by, e.g., choosing materials for the control electrodes 131 and 132 resulting in work functions of the control electrodes 131, 132 which may differ from those of the channel regions 1012 and/or 1022. Additionally or alternatively, this can be achieved by setting the control electrodes 131 and 132 to an appropriate electrical potential with respect to, e.g., the electrical potential of the first load terminal structure 11. Thus, in an embodiment, full depletion of the channel regions 1012, 1022 can be achieved due to a difference between the work function(s) of one or both of control electrodes 131, 132 on the side and the work functions(s) of one or both of the channel regions 1012, 1022 on the other side and due to setting one or both of the control electrodes 131, 132 to a defined electrical potential.

In accordance with an embodiment described herein, in order to achieve the fully depleted channel regions 1012 and 1022, the lateral dimensions in the first lateral direction X can be limited, which will be explained in more detail later.

For example, if the semiconductor device 1 is set into the conducting state, e.g., by applying a voltage within said first range between each of the control electrodes 131 and 132 on the one side and the first load terminal structure 11 on the other side (e.g., the electrical potential of each of the control electrodes 131 and 132 can be greater than the electrical potential of the first load terminal structure 11), the channel regions 1012 and 1022 may become fully depleted of mobile charge carriers of the second conductivity type. In the first channel region 1012, there may then be significantly less mobile charge carriers of the second conductivity type, e.g., holes as compared to a state wherein no positive voltage is applied. And, in the second channel region 1022, there may then also be significantly less mobile charge carriers of the second conductivity type, e.g., holes. For example, the formulation "significantly less mobile charge carriers" intends to describe, in this specification, that the amount of mobile charge carriers of the respective conductivity type is less than 10% of the mobile charge carriers of the other conductivity type.

In accordance with an embodiment, the semiconductor device 1 is configured to fully deplete the first channel region 1012 of charge carriers of the second conductivity type if a voltage applied between the first control electrode 131 and the first load terminal structure 11 is within said first range, e.g., within a range of −1 V to +3 V. According to another embodiment, the semiconductor device 1 is configured to fully deplete the first channel region 1012 if a voltage applied between the first control electrode 131 and the first load terminal structure 11 which causes an electric field within a first range, e.g., within a range of −3 MV/cm to +10 MV/cm or within a range of −2 MV/cm to +6 MV/cm or within a range of −1 MV/cm to +4 MV/cm, wherein the electric field is present with in the insulation structure 133 located between the first mesa 101 and the first control electrode 131. The same may apply analogously to the second channel region 1022.

For example, in a blocking state of the semiconductor device 1, only a current path for the second load current 152 exists in at least one of the channel regions 1012 and 1022, e.g., only in the channel region 1022, thus allowing an eventual leakage current to pass. In the blocking state, the semiconductor device 1 can be configured to build up a space charge region in the drift region 100 to enable a more positive voltage at the second load terminal structure 12 with respect to the first load terminal structure 11, which is herein referred to as a forward voltage, with no load current flowing between said first load terminal 11 and second load terminal 12 besides small leakage currents.

For switching the semiconductor device 1 from the conducting state to the blocking state, a voltage within a second range different from the first range may be applied between the first control electrode 131 and the first load terminal structure 11 so as to cut off the load current path in the first channel region 1012. For example, the second range may range from e.g., 1 V to a particular negative voltage value, e.g., −3 V, in case the load current path in the first channel region 1012 to be cut off is an electron current path. Accordingly, the second range may range from e.g., −1 V to a particular positive voltage value, e.g., +3 V, in case the load current path in the first channel region 1012 to be cut off is a hole current path. According to an embodiment, the semiconductor device 1 is configured to be rendered from the conducting state to the blocking state if a voltage applied between the first control electrode 131 and the first load terminal structure 11 causes an electric field within a second range, e.g., within a range of +3 MV/cm to −10 MV/cm or within a range of 2 MV/cm to −6 MV/cm or within a range of 1 MV/cm to −4 MV/cm, wherein the electric field is present with in the insulation structure 133 located between the first mesa 101 and the first control electrode 131. The same voltage or another voltage in the second range or yet another voltage may also be applied between the second control electrode 132 and the first load terminal structure 11. Then, an accumulation channel of mobile charge carriers of the second conductivity type may be induced in the second channel region 1022. Further, in an embodiment the second channel region 1022 forms a conductive connection towards the first load terminal structure 11 due to dopants of the second conductivity type when the same voltage or another voltage in the second range or yet another voltage may also be applied between the second control electrode 132 and the first load terminal structure 11. In this embodiment, said accumulation channel of mobile charge carriers of the second conductivity type is not needed for current transport. For example, the accumulation channel may facilitate movement of the second charge carriers of the second conductivity type out of the semiconductor body 10 to the first load terminal structure 11. This may contribute to a fast reduction of the total charge carrier concentration in the semiconductor body 10 during switch-off of the semiconductor device 1.

For switching the semiconductor device 1 from the blocking state to the conducting state, a voltage within the first range may be applied between the first control electrode 131 and the first load terminal structure 11, as described above. A current path for mobile charge carriers of the first conductivity type may then be induced in the first channel region 1012 by formation of a conductive channel. In one example, the semiconductor device 1 is configured as a so called-inversion device wherein the conductive channel is provided by a channel for minority carriers (e.g., electrons) induced in the first channel region 1012 of the second conductivity type in a commonly known manner. Alternatively, the semiconductor device 1 is configured as a so called-accumulation device wherein the conductive channel is provided by an accumulation channel of majority carriers (e.g., electrons) in the first channel region 1012 of a first conductivity type. In the case of the latter configuration, the gate structure may have opposite conductivity type dopants (e.g., p-type) as the first channel region 1012 such that a depletion region is formed due to the workfunction difference, and no conduction channel is formed at zero or negative gate bias. Upon the application of sufficient gate voltage, the device moves into accumulation mode, thereby forming a conductive channel for mobile charge carriers of the first conductivity type (e.g., electrons). The conductive channel may extend over the whole first channel region 1012 along the vertical direction Z. In a variant, the conductive channel may extend over the whole first channel region 1012 also along the first lateral direction X and/or the second lateral direction Y. At the same time, the first channel region 1012 may become fully depleted of mobile charge carriers of the second conductivity type due to said voltage being within said first range such that a flow of mobile charge carriers of the second conductivity through the first channel region 1012 between the semiconductor body 10 and the first load terminal structure 11 is strongly reduced or inhibited. The same voltage or another voltage in the first range or yet another voltage may further be applied between the second control electrode 132 and the first load terminal structure 11. The second channel region 1022 may then become fully depleted of mobile charge carriers of the second conductivity type such that a flow of mobile charge carriers of the second conductivity through the second channel region 1022 between the semiconductor body 10 and the first load terminal structure 11 is reduced or inhibited.

The semiconductor body 10 may further comprise a third port region 104 electrically connected to the second load terminal structure 12 and coupled to the drift region 100. The third port region 104 may be a third semiconductor port region. For example, the third port region 104 comprises a first emitter of the second conductivity type electrically connected to the second load terminal structure 12 and/or a second emitter having dopants of the first conductivity type electrically connected to the second load terminal structure 12, e.g., so-called n-shorts (in case the first conductivity type is n), in order to implement a reverse conductivity of the semiconductor device 1.

Further, the third port region 104 may comprise a buffer region, also known as field stop region, which may be of the same conductivity type as the drift region 100, e.g., of the first conductivity type, but may exhibit a higher dopant concentration as compared to the dopant concentration of the drift region 100. However, since these exemplarily configurations of the third port region 104 are generally known to the skilled person, in particular in the context of IGBT configurations, the first emitter, the second emitter and the buffer region are neither illustrated in FIGS. 3A-B nor explained herein in more detail.

As has been explained above, the semiconductor body 10 can be configured to conduct the total load current 15 in the forward direction between said load terminal structures 11 and 12. To this end, the first control electrode 131 may be configured to induce, in response to receiving the first control signal, a conductivechannel for conducting a part of the first load current 151 within the first channel region 1012. For example, in response to receiving the first control signal, the semiconductor device 1 can be configured to fully deplete the first channel region 1012 regarding mobile charge carriers of the second conductivity type. Accordingly, in response to receiving the second control signal, the semiconductor device 1 can further be configured to fully deplete the second channel region 1022 regarding mobile charge carriers of the second conductivity type.

In accordance with an embodiment, the first load terminal structure 11 is an emitter terminal (also referred to as "source terminal") and the second load terminal structure 12 is a collector terminal (also referred to as "drain terminal") and the control electrode structure 13 is electrically connected to a gate terminal structure (not illustrated). For example, the first port region 1011 of the first mesa 101 may hence be a source region, e.g., a semiconductor source region.

For example, for setting the semiconductor device 1 into a conducting state, during which the total load current 15 between the load terminal structures 11, 12 may be conducted in a forward direction, the first control electrode 131 may be provided with the first control signal having a voltage within a first range so as to induce a conductive channel within a first channel region 1012. For example, the voltage is applied between the first control electrode 131 and the first load terminal structure 11. In an embodiment, the electrical potential of the first control electrode 131 is greater than the electrical potential of the first load terminal structure 11 if the applied voltage is within the first range.

For setting the semiconductor device 1 into a blocking state in which a voltage applied between the second load terminal structure 12 and the first load terminal structure 11 in the forward direction may be blocked and flow of the load current 15 in the forward direction is inhibited, the first control electrode 131 may be provided with the control signal having a voltage within the second range different from the first range so as to induce a depletion region, e.g., at a transition between the first channel region 1012 and the drift region 100. For example, the voltage is applied between the first load terminal structure 11 and the first control electrode 131. In an embodiment, the electrical potential of the first control electrode 131 is equal to or lower than the electrical potential of the first load terminal structure 11 if the applied voltage is within the second range.

The operation and the configuration of the semiconductor device 1 can be summarized as follows. The semiconductor device 1 can be configured to be set into the conducting state by providing the control signal with a voltage within said first range. In response to receiving such control signal, the first cell portion 141 may be configured to induce an inversion channel within the first channel region 1012 such the first load current 151 of first charge carriers of the first conductivity type may traverse the first mesa 101. Simultaneously, the first cell portion may be configured to fully deplete the first channel region 1012 with regards to charge carriers of the second conductivity type and to thus drastically reduce or inhibit a flow of the second load current 152 within the first mesa 101. Further, in response to receiving such control signal, the second cell portion 142 may be configured to fully deplete the second channel region 1022 with regards to charge carriers of the second conductivity type and to thus inhibit a flow of each of first load current 151 and the second load current 152 within the second mesa 102. Thus, during the conducting state, the total load current within the cell portions 141 and 142 may be at least dominated or even constituted by the first load current 151 only, as the second load current 152 substantially amounts to zero within said cell portions 141 and 142. For switching the semiconductor device 1 from the conducting state to the blocking state, the control signal may be provided with a voltage within said second range different form the first range. In response to receiving such control signal, the semiconductor device 1 may be configured to cause movement of mobile charge carriers out of the semiconductor body 10. To this end, the first cell portion 141 may be configured to cut-off the first load current 151 within the first mesa 101 by breaking down said inversion channel. Simultaneously or shortly before the cut-off of the first load current 151 within the first mesa 101, the second cell portion 142 may be configured to induce a conductive channel within the second channel region 1022 so as to allow flow of the second load current 152 within the second mesa. In fact, such second load current 152 can be considered to a be a charge carrier removal (or drainage) current, as it causes the semiconductor body 10 to reduce the concentration of the charge carriers of the second conductivity type or even to be depleted regarding second charge carriers of the second conductivity type. Thus, during switch-off, the total load current 15 within the cell portions 141 and 142, i.e., the total load current 15 in proximity to the first load terminal structure 11, may dominated by or even substantially be constituted by the second load current 152 within the second cell portion 142.

Figure 4:
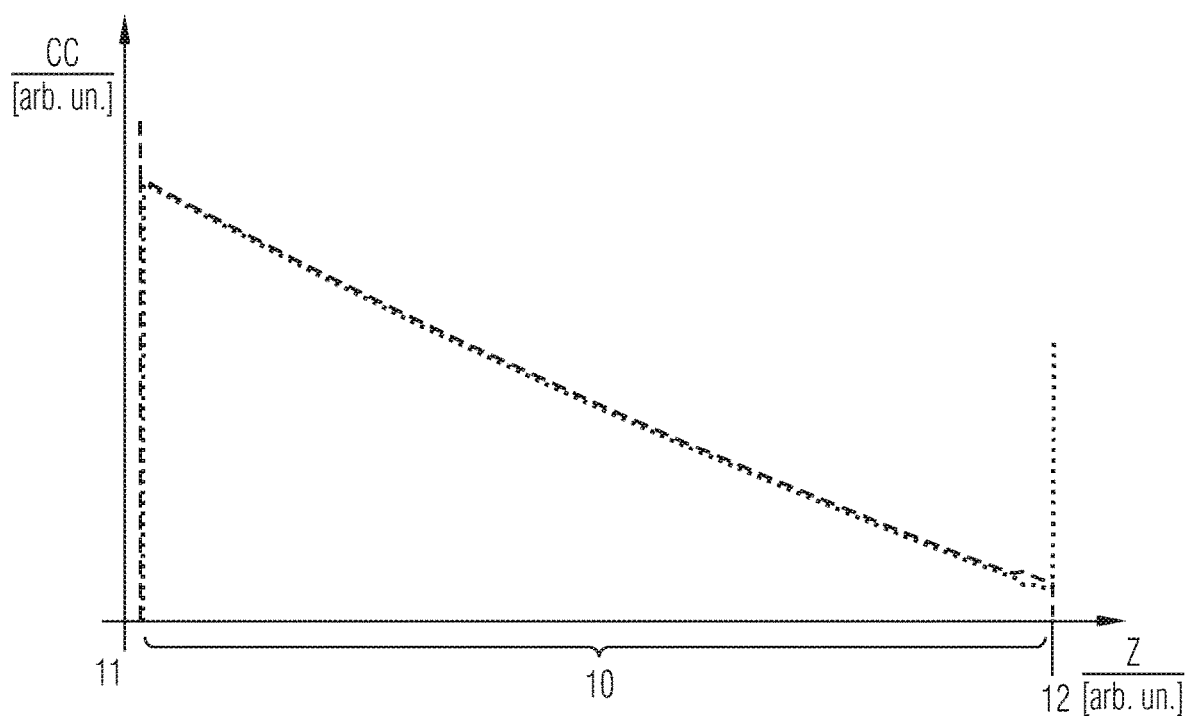
FIG. 4 schematically illustrates a distribution of a charge carrier concentration in a semiconductor body of a power semiconductor device in accordance with one or more embodiments.

FIG. 4 schematically illustrates exemplary distributions of charge carrier concentrations in the semiconductor body 10 of the semiconductor device 1 when being in the conducting state, in accordance with one or more embodiments. The dashed line exemplarily illustrates the distribution of the concentration (CC) of charge carriers of the first conductivity type, e.g., electrons, along the vertical direction Z, and the dotted line exemplarily illustrates the distribution of the concentration (CC) of charge carriers of the second conductivity type, e.g., holes, along the vertical direction Z. As illustrated, in proximity to the first load terminal structure 11, e.g., within the cell portions 141 and 142 the concentration of the charge carriers of the first conductivity type can be higher as compared to the concentration of the charge carriers of the second conductivity type, e.g., due to the reasons as they were outlined in the preceding paragraph and because doping regions in the cell portions 141 and 142 may contribute to the curves.

Along the extension of the semiconductor body 10 in the vertical direction Z, e.g., within the drift region 100, the concentration of the charge carriers of the first conductivity type can be substantially equal to the concentration of the charge carriers of the second conductivity type, e.g., due to the physical requirement of charge neutrality that may be established within the electron-hole plasma inside the drift region 100.

In proximity to the second load terminal structure 12, the concentration of the charge carriers of the second conductivity type may be significantly higher as compared to the concentration of the charge carriers of the first conductivity type, e.g., since charge carriers of the first conductivity type may continuously move from the semiconductor body 10 to the second load terminal structure 12, and wherein charge carriers of the second conductivity type may be continuously pumped into the drift region 100 out of said first emitter that may be included within the third port region 104 electrically connected to the second load terminal structure 12, wherein the first emitter may comprise dopants of the second conductivity type. According to another embodiment not illustrated in FIG. 4, in proximity of the second load terminal structure 12, also the density of the charge carriers of the first conductivity type may be much larger in an area close to a doping region of the first conductivity type, e.g., in order to implement a reverse conductivity of the semiconductor device 1 as stated earlier. In an area of a buffer or field stop region, differences in the densities of the charge carriers of the first and second conductivity type may occur.

For example, the semiconductor device 1 may be configured to induce, within the semiconductor body 10, e.g., within the drift region 100, a total concentration of charge carriers greater than $10^{16}$ cm$^{-3}$, or even greater than $10^{17}$ cm$^{-3}$, or even greater than $2*10^{17}$ cm$^{-3}$. Such high concentration of charge carriers may allow for achieving a comparatively low on-state voltage during the conducting state, i.e., a voltage between the first load terminal structure 11 and the second load terminal structure 12 of less than 1 V, less than 0.9 V, or even less than 0.8 V at a nominal load current or at a load current density flowing through a horizontal cross-section of the semiconductor device of at least 100 A/cm$^2$ and at about 20° C. Said on-state voltage may be substantially caused by a pn-junction in proximity to the second load terminal structure 12. Thus, the drop of the on-state voltage may be asymmetrically distributed along the distance between the first load terminal structure 11 and the second load terminal structure 12, e.g., due to the main change in voltage occurring in proximity to the second load terminal structure 12 and a negligible voltage change occurring in proximity to the first load terminal structure 11. If, for example, the semiconductor body is mainly based on silicon (Si), an on-state voltage of significantly less than 0.7 V can hardly be achieved.

Figure 5A:
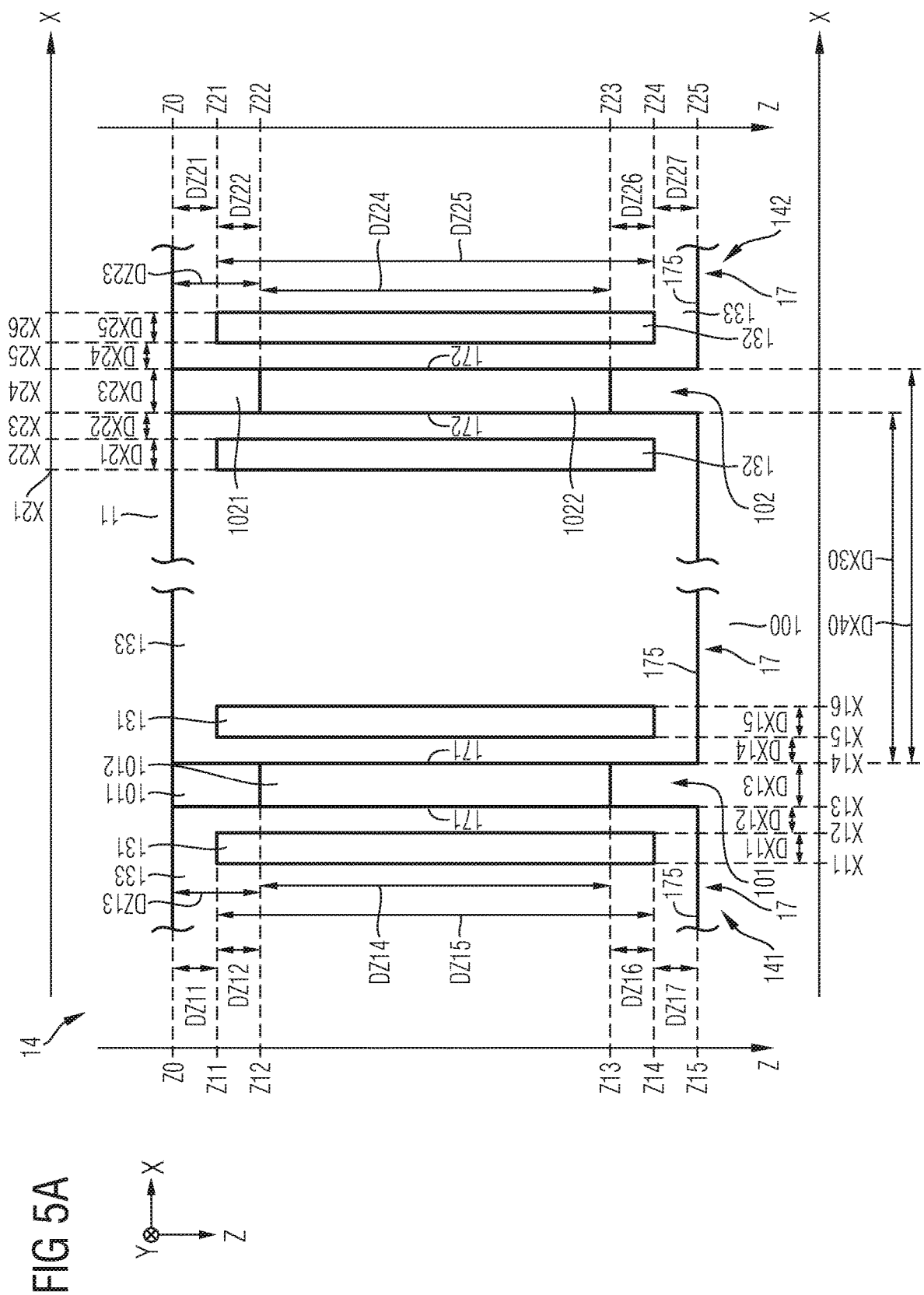
FIG. 5A schematically illustrates a section of a vertical cross-section of a power semiconductor device in accordance with one or more embodiments.

With regards to FIG. 5A, some exemplarily spatial dimensions of the first cell portion 141 and the second cell portion 142 shall be explained. Before giving specific values, it shall be understood that the each cell 14 (including the first cell portion 141 and the second cell portion 142) may either exhibit a stripe configuration or a needle configuration, as has been explained with respect to FIG. 1A.

Figure 5B:
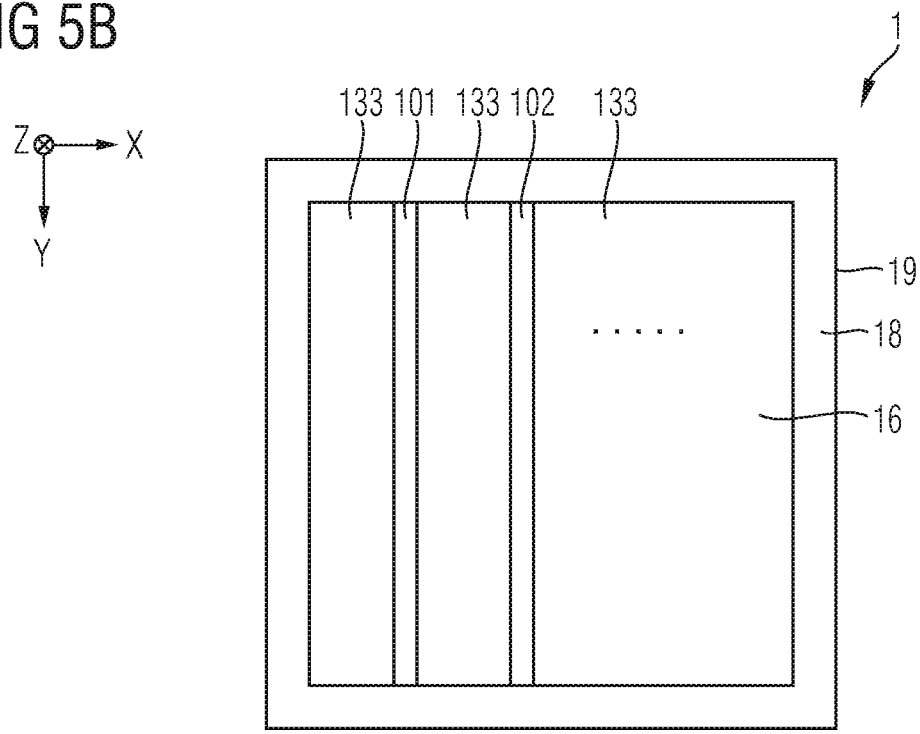
FIGS. 5B-5C each schematically illustrate a section of a horizontal projection of a power semiconductor device in accordance with some embodiments.

In the first case ("stripe"), as schematically illustrated in FIG. 5B (not to scale!), each of the first mesa 101 and the second mesa 102 may exhibit the shape of a fin that has a total lateral extension along the one lateral direction (e.g., Y) that amounts to at least a multiple of the total lateral extension in the other lateral direction (e.g., X). For example, the fin shaped mesa 101 and 102 may extend substantially along the entire active cell field 16 in one lateral direction.

Figure 5C:
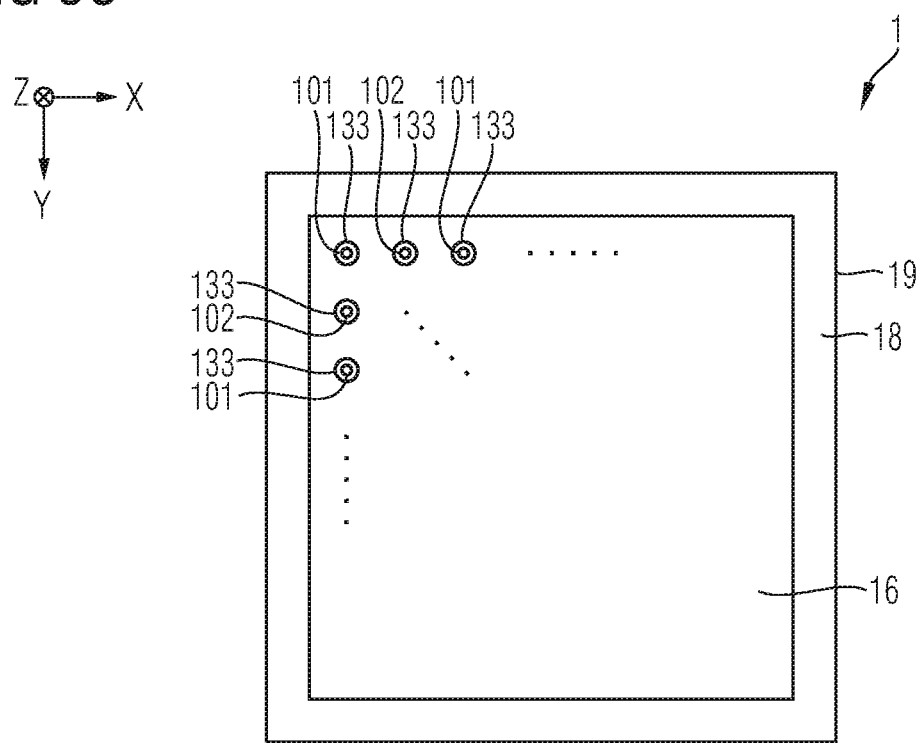

In the second case ("needle"), as schematically illustrated in FIG. 5C (not to scale!), each of the first mesa 101 and the second mesa 102 may exhibit the shape of a wire. For example, the mesa 101 and 102 may each have a circular or rectangular cross-section in parallel to a horizontal plane and may each be completely surrounded by the insulation structure 133.

Thus, in accordance with the embodiment schematically illustrated in FIG. 5A, the cell portions 141 and 142 may exhibit a needle configuration or a stripe configuration, for example. In another embodiment, the first cell portion 141 may exhibit a stripe configuration and the second cell portion 142 may exhibit a needle configuration or vice versa.

In an embodiment, the first port region 1011 and the second port region 1021 each extend, from their respective contact with the first load terminal structure 11 at the level Z0 (which may be at 0 nm), along the vertical direction Z to a level Z12 or, respectively, to a level Z22, which may each be within the range of 30 nm to 500 nm, within the range of 50 nm to 400 nm, or within the range of 50 nm to 300 nm. The levels Z12 and Z22 may be substantially identical to each other. Accordingly, along the vertical direction Z, the first port region 1011 may have a total extension DZ13 with within the range of 30 nm to 500 nm, within the range of 50 nm to 400 nm, or within the range of 50 nm to 300 nm, and the second port region 1021 may have a total extension DZ23 in the vertical direction substantially identical to DZ13.

Further, the first channel region 1012 and the second channel region 1022 may each extend, from the contact with the first port region 1011 at the level Z12 or, respectively, from the contact with the second port region 1021 at the level Z22, along the vertical direction Z to a level Z13 or, respectively, to a level Z23, which may each be within the range of 50 nm to 700 nm, within the range of 60 nm to 550 nm, or within the range of 100 nm to 400 nm. The levels Z13 and Z23 may be identical to each other. Accordingly, along the vertical direction Z, the first channel region 1012 may have a total extension DZ14 with within the range of 50 nm to 700 nm, within the range of 80 nm to 550 nm, or within the range of 150 nm to 400 nm, and the second channel region 1022 may have a total extension DZ24 in the vertical direction substantially identical to DZ14.

The first control electrode 131 and the second control electrode 132 may be spaced apart from the first load terminal structure 11 along the vertical direction Z by a distance DZ11 or, respectively, DZ21, which may be equal to DZ11. Thus, said distances DZ11 and DZ21 may be identical to the thickness of the section of the insulation structure 133 that isolates the control electrodes 131 and 132 from the first load terminal structure 11 along the vertical direction Z. Each of DZ11 and DZ21 can be within the range of 10 nm to 490 nm, within the range of 20 nm to 180 nm, or within the range of 30 nm to 250 nm. In other words, the first control electrode 131 may exhibit a proximal end that is arranged at a level Z11 corresponding to DZ11 in terms of magnitude, and the second control electrode 132 may exhibit a proximal end that is arranged at a level Z11 corresponding to DZ21 in terms of magnitude.

In an embodiment, the first control electrode 131 may exhibit a total extension DZ15 along the vertical direction Z that is greater than the total extension DZ14 of the first channel region 1012 and can be arranged such that it exhibits a common extension range along the vertical direction Z with the first channel region 1012 greater than 100% of the total extension DZ14 of the first channel region 1012, as schematically illustrated in FIG. 5A. Thus, said total extension DZ15 of the first control electrode 131 may amount to at least a factor of 1.1 of DZ14, a factor of 1.3 of DZ14 or even to a factor of 1.5 of DZ14. Against the vertical direction Z, there may be an overlap DZ12 within the range of 10 nm to 490 nm, within the range of 20 nm to 380 nm, or within the range of 50 nm to 250 nm, which may be, at the same time, a common extension range with the first port region 1011. In the vertical direction Z, the first control electrode 131 may exhibit an overlap DZ16 within the range of 10 nm to 490 nm, within the range of 20 nm to 380 nm, or within the range of 30 nm to 250 nm, which may be, at the same time, a common extension range with the drift region 100. Further, the first control electrode 131 may exhibit a distal end at a level Z14 that is spaced apart from a distal end of the insulation structure 133 at a level Z15 by a distance DZ17, which may be within the range of 60 nm to 1200 nm, within the range of 100 nm to 900 nm, or within the range of 200 nm to 650 nm.

What has been stated above with respect to extension and the arrangement the first control electrode 131 along the vertical direction Z may equally apply to the second control electrode 132 and its relative position with respect to the second channel region 1022. Thus, the values of DZ25 may be within the same range as DZ15, the values of DZ21 may be within the same range as DZ11, the values of DZ22 may be within the same range as DZ12, and the values of DZ26 may be within the same range as DZ16. Further, the second control electrode 132 may exhibit a distal end at level Z24 that is spaced apart from a distal end of the insulation structure 133 at level Z25 by a distance DZ27, wherein the values of DZ27 may be within the same range as DZ17.

The upper and lower vertical ends of the first control electrode 131 (Z11, Z14) and the second control electrode 132 (Z21, Z24) may be only specified in vicinity of or adjacent to the first channel region 1012 and second channel region 1022, as stated above. Proceeding further in the first lateral direction X away from first channel region 1012 or second channel region 1022, the upper and/or lower vertical ends of the control electrodes 131, 132 may differ. The upper ends (cf. reference numeral Z11' in FIG. 6) may e.g., be located even above position Z0 or below position Z0. The lower ends Z14 and Z24 may e.g., be located even below position Z15 or above position Z15. It is clear that, irrespective of the chosen spatial dimensions, the first control electrode 131 and second control electrode 132 still is electrically insulated from the first load terminal structure 11 and the drift region 100, in accordance with an embodiment.

Along the first lateral direction X, the first control electrode 131 may be spaced apart from the first channel region 1021 by a distance DX12 that may be within the range of 1 nm to 100 nm, within the range of 2 nm to 50 nm, or within the range of 3 nm to 20 nm. Said distance DX12 may be identical to a thickness of the insulation structure 133 that isolates the first control electrode 131 from the first mesa 101 along the first lateral direction X. Accordingly, along the first lateral direction X, the second control electrode 132 may be spaced apart from the second channel region 1022 by a distance DX22 that may be within the range of 1 nm to 100 nm, within the range of 2 nm to 50 nm, or within the range of 3 nm to 20 nm. Said distance DX22 may be identical to a thickness of the insulation structure 133 that isolates the second control electrode 132 from the second mesa 102 along the first lateral direction X.

The thickness DX11 of the first control electrode 131 along the first lateral direction X may be within the range of 10 nm to 10,000 nm, within the range of 50 nm to 7,000 nm, or within the range of 100 nm to 5,000 nm. The thickness DX21 of the second control electrode 132 along the first lateral direction X may be in same range as the thickness DX11 or in another of said ranges described above with regard to the thickness DX11. As mentioned in the above, in contrast to the exemplary schematic representation in FIG. 5A, the control electrodes 131 and 132 can be in contact with each other (i.e., in FIG. 5A, X16 would be equal to X21) in accordance with one or more embodiments, thereby forming a joint control electrode that may be used for controlling each of the first cell portion 141 and the second cell portion 142.

In the embodiment in accordance with FIG. 5A, the cells 14 may exhibit a needle configuration or a stripe configuration, as has been explained above. For example, in the first case ("needle") the cells 14 may each exhibit, e.g., a radially symmetrical structure and the section of the vertical cross-section of FIG. 5A indeed only depicts a single first control electrode 131 exhibiting, e.g., a cylinder shape, and a single second control electrode 132 exhibiting, e.g., also a cylinder shape coating the first mesa 101 or, respectively, the second mesa 102. In this case, each of the first lateral direction X and the second lateral direction Y denote denotes a radial direction. Further, the needle cells could also exhibit, in parallel to the YX plane, a rectangular cross-section, e.g., with rounded corners or an elliptical cross-section. In the second case ("stripe"), the first cell portion 141 may comprise a monolithic first control electrode 131 that flanks the first mesa 101 only on one lateral side, and, accordingly, the second cell portion 142 may also comprise a monolithic second control electrode 131 that flanks the second mesa 102 only on one lateral side. In another embodiment, as illustrated in FIG. 5A, the first control electrode 131 can be a multi-part, e.g., a two-part first electrode 131, and the second control electrode 132 can also be a multi-part, e.g., a two-part second electrode 132. For example, in accordance with the embodiment of FIG. 5A, if the cells 14 exhibit a stripe configuration, the first control electrode 131 may be a two-part first control electrode 131 arranged mirror symmetrically along the first lateral direction X with regards to the first mesa 101, and the second control electrode 132 may be a two-part second control electrode 132 arranged mirror symmetrically along the first lateral direction X with regards to the second mesa 101. Thus, what has been stated above with respect to the dimension DX11, DX21 and DX12, DX22 may equally apply to the dimensions DX14, DX24 and DX15, DX25 indicated in FIG. 5A.

As has been explained above, the spatial dimensions of the mesa 101 and 102 and their components may each be confined by the insulation structure 133. The total extension Z15 of each of the first mesa 101 and the second mesa 102 in parallel to the path of the first load current 151 or, respectively, the second load current 152, which may be in parallel to the vertical direction Z, may amount to at least a multiple of the respective total extensions DX13, DX23 perpendicular to the load current paths, e.g., in at least one of the first lateral direction X and the second lateral direction Y.

For example, the width DX13 of the first channel region 1012 of the first mesa 101 in a direction perpendicular to the course of the first load current 151 within the first mesa 101, e.g., in a direction perpendicular to the vertical direction Z, e.g., the first lateral direction X, may be smaller than 100 nm, smaller than 60 nm, or even smaller than 40 nm over a distance in a direction of first load current 151 within the first mesa 101, e.g., along a direction in parallel to the vertical direction Z, amounting to at least three times of DX13. For example, the first channel region 1012 may exhibit a width of DX13 smaller than 100 nm along at least 300 nm in the vertical direction Z, a width of DX13 smaller than 60 nm along at least 180 nm in the vertical direction Z, or a width of DX13 smaller than 40 nm along at least 120 nm in the vertical direction Z. FIG. 5A shows the first mesa 101 with substantially parallel sidewalls. In contrast to this, the first mesa 101 may also have partially or fully tapered sidewalls, e.g., with a lateral width DX13 being larger at vertical position Z13 than DX13 at vertical position Z12 by up to 50%. The extension of the first channel region 1012 along the vertical direction Z DZ14 may be related to the larger or smaller value of DX13.

Analogously, the width DX23 of the second channel region 1022 of the second mesa 102 in a direction perpendicular to the course of the second load current 152 within the second mesa 102, e.g., in a direction perpendicular to the vertical direction Z, e.g., the first lateral direction X, may be smaller than 100 nm, smaller than 60 nm, or even smaller than 40 nm over a distance in a direction of second load current 152 within the second mesa 102, e.g., along a direction in parallel to the vertical direction Z, amounting to at least three times of DX23. For example, the second channel region 1022 may exhibit a width of DX23 smaller than 100 nm along at least 300 nm in the vertical direction Z, a width of DX23 smaller than 60 nm along at least 180 nm in the vertical direction Z, or a width of DX23 smaller than 40 nm along at least 120 nm in the vertical direction Z. FIG. 5A shows the second mesa 102 with substantially parallel sidewalls. In contrast to this, the second mesa 102 may also have partially or fully tapered sidewalls, e.g., with a lateral width DX23 being larger at vertical position Z23 than DX23 at vertical position Z22 by up to 50%. The extension of the second channel region 1022 along the vertical direction Z DZ24 may be related to the larger or smaller value of DX23.

It shall be understood that, in contrast to the schematic representation in FIG. 5A, the insulation structure 133 need not necessarily extend at least as far in the vertical direction Z as the first control electrode 131 along the entire distance DX30 between the first mesa 101 and the second mesa 102, but may extend less in the vertical direction Z, e.g., being in the same range as the total extension of the first port region 1011 or, respectively, the total extension of the second port region 1021 in the vertical direction Z (DZ13, DZ23 in FIG. 5A), e.g., along at least 80% of the distance DX30 between the first mesa 101 and the second mesa 102.

The distance between the first cell portion 141 and the second cell portion 142 along one of the first lateral direction X and the second lateral direction Y, in the following also referred to as "intra-cell pitch" DX40, may be within the range of 100 nm to 15,000 nm, within the range of 300 nm to 10,000 nm, or within the range of 500 nm to 8.000 nm.

In an embodiment, the first mesa 101 is dimensioned in accordance with following equation (1) presented below $$DX13 \le 2*Wmax;$$

$$Wmax = \sqrt{\frac{4*\varepsilon*k*T*\ln\left(\frac{N_A}{n_i}\right)}{q^2*N_A}}$$

Accordingly, in an embodiment, DX13, i.e., the width of the first channel region 1011, is equal to or smaller than twice of a maximal width Wmax along at least 80%, at least 90%, or along at least 95%, or even along at least 99% of the total extension of the first mesa 101 in the vertical direction Z, the maximal width Wmax being determined in accordance with equation (1) presented above, wherein ε=dielectric constant of the material of the first channel region 1012;
k=Boltzmann constant;
T=Temperature;
ln denotes the natural logarithm;
$N_A$=dopant concentration of the material of the first channel region 1012;
$n^i$=intrinsic carrier concentration (e.g., $1.45*10^{10}$ in case of Si at 27° C.); and
q=elementary charge.

In an embodiment, the second mesa 102 is accordingly dimensioned, i.e., DX23 being equal to or smaller than twice of a maximal width Wmax along at least 80%, at least 90%, or along at least 95%, or even along at least 99% of the total extension of the first mesa 101 in the vertical direction Z, the maximal width Wmax being determined with values applicable for the second channel region 1022.

In another embodiment, the second mesa 102 can exhibit a width DX23 significantly greater than the width DX13 of the first mesa 101, e.g., at least twice as great, or even at least ten times greater than DX13.

For example, DX13 (and, optionally) DX23 is within a range of 15 nm to 100 nm, while each of the dopant concentration of the first channel region 1012 and the dopant concentration of the second channel region 1022 is greater than $8*10^{18}$ cm³.

In an embodiment, each of the first port region 1011, the first channel region 1012, the second port region 1021 and the second channel region 1022 may thus constitute a nanometer-scale structure having a spatial dimension in at least one of the first lateral direction X, the second lateral direction Y and the vertical direction Z of less than 100 nm. In an embodiment, said at least one direction along which the respective region exhibits an extension of less than 100 nm is perpendicular to the direction of the applicable load current conducted within the respective region.

Figure 6:
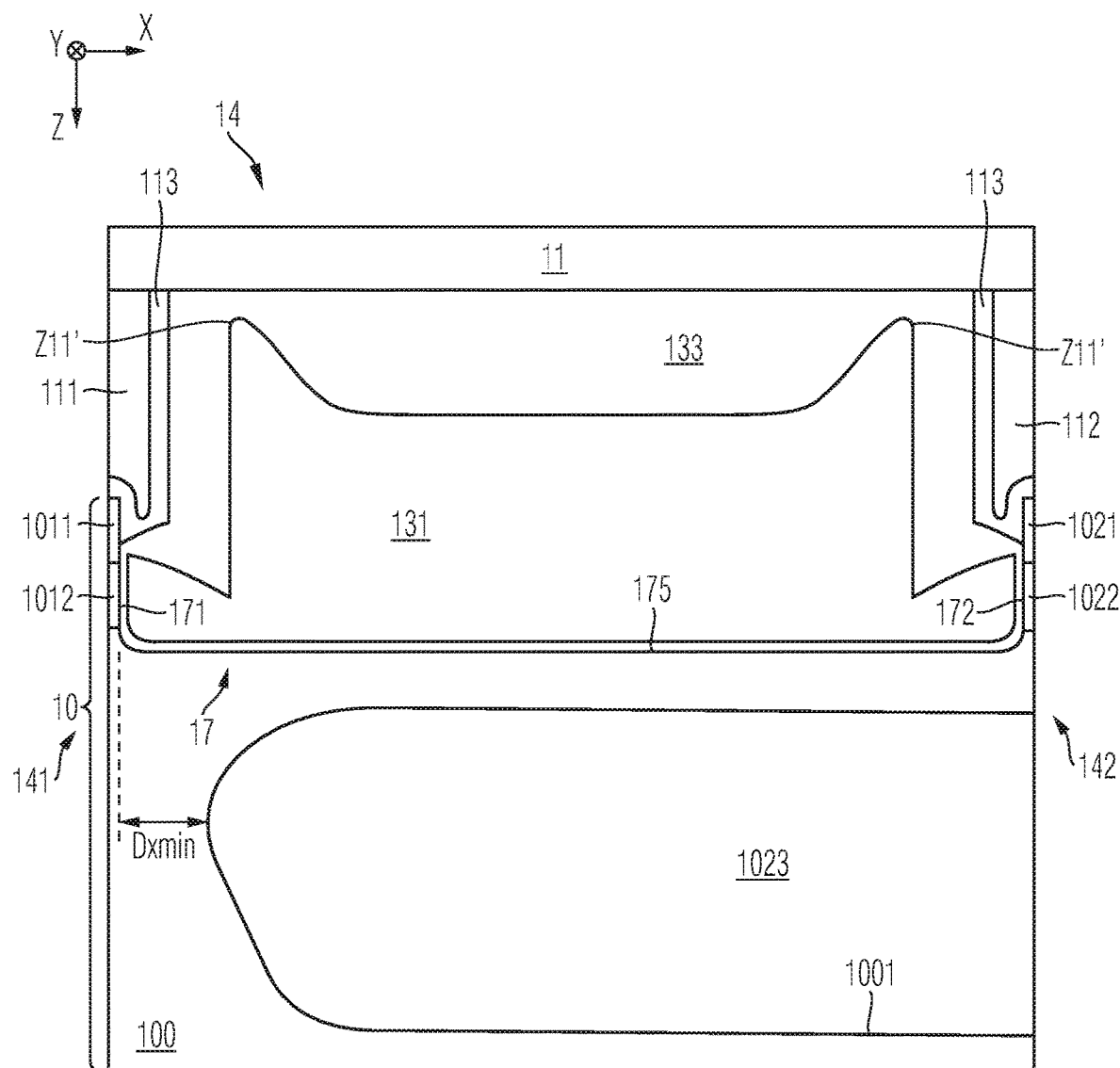
FIG. 6 schematically illustrates a section of a vertical cross-section of a power semiconductor device in accordance with one or more embodiments.
Figure 7A:
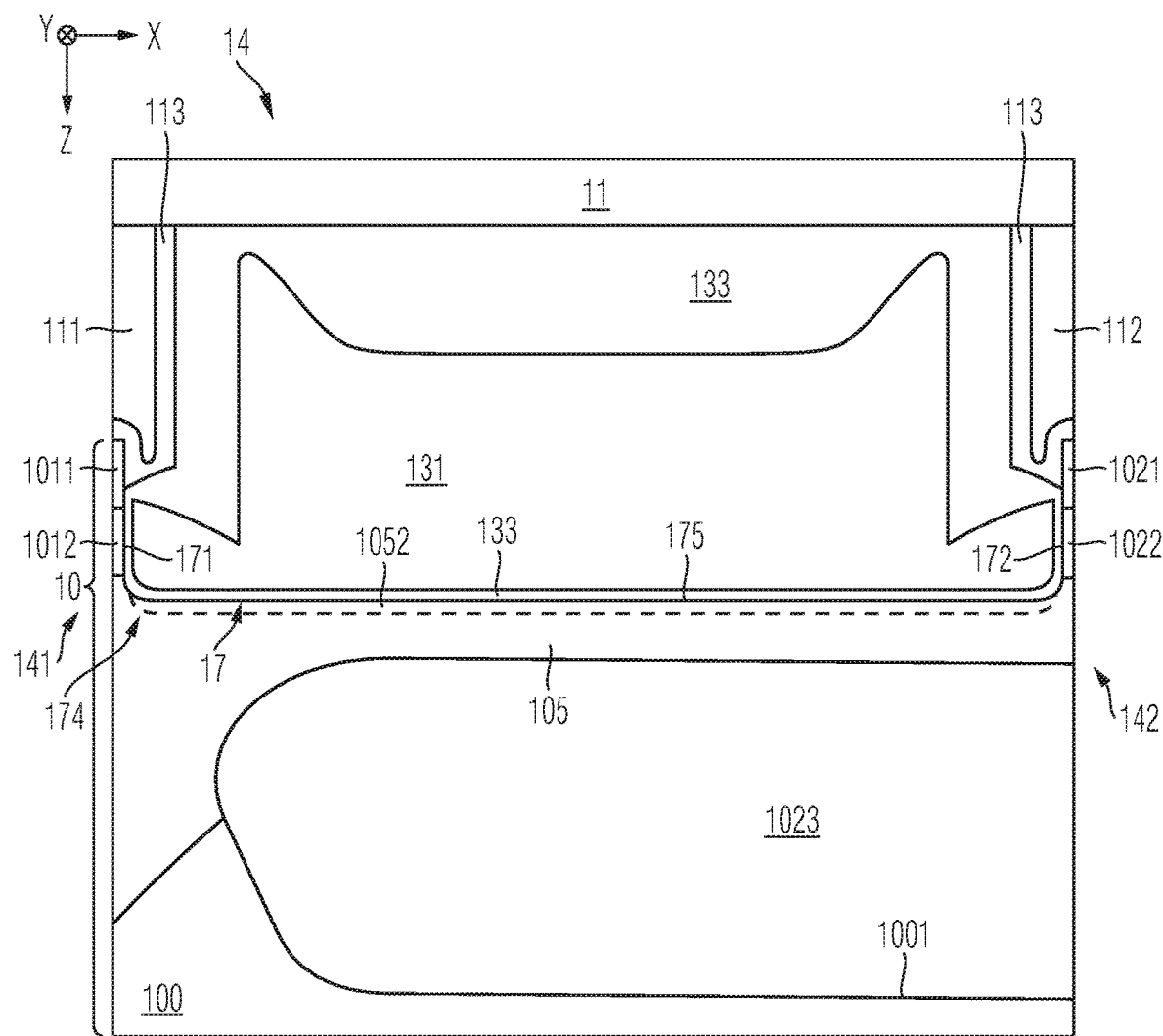
FIGS. 7A-7B each schematically illustrate a section of a vertical cross-section of a power semiconductor device in accordance with some embodiments.

It is now being referred to the embodiments of the power semiconductor device 1 schematically and exemplarily illustrated in FIG. 6 and FIG. 7A:

The power semiconductor device 1 has the semiconductor body 10 coupled to the first load terminal structure 11 and the second load terminal structure 12, as explained above. The semiconductor body 10 is configured to conduct the load current (cf. reference numeral 15 in the previous drawings) and comprises the drift region 100 of the first conductivity type, as explained above. The power semiconductor device 1 includes the plurality of cells 14. The cells 14 may be equally configured, and a section of one cell 14 is shown in FIG. 6. Accordingly, each cell 14 comprises the first mesa 101 included in the first cell portion 141, the first mesa 101 including: the first port region of the first conductivity type 1011 being electrically connected to the first load terminal structure 11, and the first channel region 1012 being coupled to the drift region 100, wherein, optionally, the first mesa 101 exhibits a total extension (cf. reference numeral DX13) of less than 100 nm in the first lateral direction X perpendicular to the vertical direction Z of the load current part within the first mesa 101, as explained above. For example, a first contact plug 111 may be employed for establishing an electrical connection between the first load terminal structure 11 and the first port region 1011. For example, in the region where the first contact plug 111 is to be provided, the insulation structure 133 may be at least partially covered with a liner 113, as illustrated. According to an embodiment, the first contact plug 111 has a width that is at least twice the width DX13 of the first mesa 101. Optionally, the first contact plug 111 may contact the first mesa 101 and/or the second mesa in more than one location.

Each cell 14 further comprises the second mesa 102 included in the second cell portion 142, the second mesa 102 including: the second port region of the second conductivity type 1021 and being electrically connected to the first load terminal structure 11, and the second channel region 1022 being coupled to the drift region 100, as explained above. For example, a second contact plug 112 may be employed for establishing an electrical connection between the first load terminal structure 11 and the second port region 1021. For example, in the region where the second contact plug 112 is to be provided, the insulation structure 133 may be partially covered with the liner 113, as illustrated.

Each cell 14 further comprises the trench structure 17 including the control electrode structure 13 (e.g., implemented as the joint/first control electrode 131) for controlling the load current at least by means of the conductive channel in the first channel region 1012, as explained above.

In accordance with an embodiment, each cell 14 further comprises a guidance zone 1023 of the second conductivity type arranged below the second channel region 1022, wherein the guidance zone 1023 laterally overlaps with the second mesa 102 and laterally extends towards the first mesa 101 while not laterally overlapping therewith, as illustrated in both FIG. 6 and FIG. 7A.

For example, the guidance zone 1023 may entirely overlap with the second mesa 102, e.g. along both the first lateral direction X and the second lateral direction Y.

In an embodiment, it may also be possible that the guidance zone 1023 at least partially laterally overlaps with the first mesa 101, e.g., in a portion of the edge termination zone 18 and/or within a portion of the active cell field 16. In an embodiment, at least for 80% of the active cell field 16, there is no lateral overlap between the guidance zone 1023 and the first mesas 101. In the remaining 20% of the active cell field 16, there may (or may not) be a lateral overlap between the guidance zone 1023 and the first mesas 101. For example, the ratio between said portions of the active cell field may not amount to 80% to 20%, but can, e.g., be of 90% to 10%, or of 95% to 5% (i.e., in 95% of the active cell field there is no lateral overlap between the guidance zone 1023 and the first mesas 101.

Further, in an embodiment, at least for 80% of the active cell field 16, there is a full lateral overlap between the guidance zone 1023 and the second mesas 102. In the remaining 20% of the active cell field 16, there may (or may not) be a lateral overlap between the guidance zone 1023 and the second mesas 102. For example, the ratio between said portions of the active cell field may not amount to 80% to 20%, but can, e.g., be of 90% to 10%, or of 95% to 5% (i.e., in 95% of the active cell field there is a lateral overlap between the guidance zone 1023 and the second mesas 102.

Further, in an embodiment, at least for 80% of the active cell field 16, there is a lateral overlap between the guidance zone 1023 and at least 30% of the total extensions of the first control electrodes 131 in the first lateral extension X. In the remaining 20% of the active cell field 16, there may (or may not) be a lateral overlap between the guidance zone 1023 and first control electrodes 131. For example, the ratio between said portions of the active cell field may not amount to 80% to 20%, but can, e.g., be of 90% to 10%, or of 95% to 5% (i.e., in 95% of the active cell field there is no lateral overlap between the guidance zone 1023 and the first mesa 101.

In an embodiment, as illustrated in FIG. 6, the guidance zone 1023 is arranged below the second channel region 1022 while being spatially displaced from both first and the second channel region 1012, 1022 along the vertical direction Z. Additionally or alternatively thereto, in an embodiment, as illustrated in FIG. 7A, each cell 14 may further comprise a barrier zone 105 of the first conductivity type being arranged between the guidance zone 1023 and the trench structure 17, wherein, optionally, the barrier zone 105 has a dopant concentration at least twice as great as the dopant concentration of the drift region 100.

The guidance zone 1023 can exhibit a dopant concentration of at least $10^{15}$ cm$^{-3}$, of at least $10^{16}$ cm$^{-3}$, or of at least $2*10^{17}$ cm$^{-3}$. In an embodiment, the dopant concentration of the guidance zone 1023 is at least as great as a total concentration of charge carriers present in the drift region 100 during the conducting state of the device 1, e.g., at least $2*10^{17}$ cm$^{-3}$. The dopant concentration of the guidance zone 1023 may vary, e.g., at least along one of the vertical direction Z and the first lateral direction X. For example, a maximum of the dopant concentration may be present within an inner part (with respect to the vertical direction Z), e.g., within an upper inner part. Further, the dopant concentration may decrease along the direction towards the first mesa 101. The dopant concentration may be asymmetric with respect to the vertical direction Z and may, e.g., have a deeper tailing characteristic in the direction towards the second load terminal structure 12 as compared to the direction towards the first load terminal structure 11; i.e., the decrease of the dopant concentration of the guidance zone 1023 may be present for a longer distance towards the second load terminal structure 12 as compared to a decrease of the dopant concentration of the guidance zone 1023 along a distance towards the first load terminal structure 11.

For example, the guidance zone 1023 is neither electrically connected to the first load terminal structure 11 nor to the second load terminal structure 12. For example, the guidance zone 1023 is separated from the second load terminal structure 12 at least by means of a section of the drift region 100.

Further, the guidance zone 1023 may be separated from the second channel region 1022 by means of semiconductor portion of the first conductivity type, e.g., by at least one of a section of the drift region 100 and a section of the barrier zone 105.

In an embodiment, a minimum distance along the vertical direction Z between the second channel region 1022 and the guidance zone 1023 amounts to at least 50 nm, to at least 100 nm, or to at least 250 nm.

In an embodiment, a maximum distance along the vertical direction Z between the second channel region 1022 and the guidance zone 1023 amounts to no more than 3000 nm, to no more than 1500 nm, or to no more than 500 nm.

Hence, the guidance zone 1023 may be separated from the second channel region 1022 by distance within the minimum distance and the maximum distance mentioned above.

Further, a minimum distance DXmin along the first lateral direction X between the guidance zone 1023 and the first mesa 101 amounts to at least 100 nm. This distance however is not greater than 1000 nm or not greater than 500 nm, in accordance with an embodiment.

However, as indicated above, whereas within the active cell field 16, the guidance zones 1023 are typically separated from the second channel regions 1022 by means of semiconductor portions of the first conductivity type, it can be appropriate, within the edge termination zone 18, to provide for at least one path (not illustrated) of the second conductivity type between one of the guidance zones and the first load terminal structure 11.

The barrier zone 105 may laterally overlap (partially or entirely) with both the first mesa 101 and the second mesa 102. Thus, the channel region 1012 of the first mesa 101 and the channel region 1022 of the second mesa 102 may be connected to each other within the semiconductor body 10 by means of
 a) a first path of the first conductivity type, e.g., formed by means of the barrier zone 105 and/or by means of a section of the drift region 100; and
 b) a second path having npn-configuration formed by the barrier zone 105 (or, respectively, a section of the drift region 100) and by the guidance zone 1023 (forming the p-part of the npn-configuration of the second path).

As illustrated in both FIGS. 6 and 7A, and as has been explained further above, the control electrode structure 13 may include the first control electrode 131 within the trench structure 17. The first control electrode 131 can be configured in such a way that it may control both the conductive channel within the first channel region 1012 and the accumulation channel within the second channel region 1022. If the first control electrode 131 is configured in such a way, it may hence also be referred to as joint control electrode 131.

In an embodiment, the guidance zone 1023 laterally overlaps with the first (joint) control electrode 131 along the first lateral direction X for at least 60%, or for at least 80% of the total lateral extension of the first control electrode 131 in this first lateral direction X. Thus, a significant lateral overlap is formed between the first (joint) control electrode 131 and the guidance zone 1023. For example, the guidance zone 1023 can thereby be configured to shield the first (joint) control electrode 131 against an electrical potential within the drift region 100, thereby reducing an undesired capacitive coupling. This may yield an improved controllability of a switching operation. According to an embodiment, the first (joint) control electrode 131 can simultaneously or alternatively have an unshielded subportion that has no lateral overlap with the guidance zone 1023, e.g., such unshielded region of the first (joint) control electrode 131 is smaller than 40% or 20% of the total lateral extension of the first control extension of the first control electrode 131 in the first lateral direction X. According to a further embodiment, the unshielded subportion of the first control electrode 131 is shorter than 1000 nm or shorter than 500 nm in the first lateral direction. For example, the unshielded subportion of the first control electrode 131 is the subportion of the first control electrode 131 that is closest to the first mesa 101.

The trench structure 17 that houses the first (joint) control electrode 131 can comprise a first trench sidewall 171 interfacing with the first mesa 101, a second trench sidewall 172 interfacing with second mesa 102, and a trench bottom 175 between the first trench sidewall 171 and the second trench sidewall 172. The first (joint) control electrode 131 may extend approximately from the first sidewall 171 to approximately the second trench sidewall 172, wherein first (joint) control electrode 131 does neither contact the first mesa 101 nor the second mesa 102 but is electrically insulated therefrom by means of the insulation structure 133.

For example, the trench bottom 175 interfaces with either the drift region 100 or, if present, with the barrier zone 105 that may exhibit a significantly increased dopant concentration as compared to the drift region dopant concentration.

For example, providing the barrier zone 105 may be appropriate if the first control electrode 131 substantially extends from the first trench sidewall 171 to the second trench sidewall 172, i.e., if the first control electrode 131 is the joint control electrode for both the first mesa 101 and the second mesa 102. Then, an undesired capacitive coupling between the semiconductor body 10 and the first (joint) control electrode 131 can be avoided by means of the barrier zone 105 and even be more effectively avoided by means of a barrier subzone 1052 (cf. more detailed explanation below). If, in another embodiment, the control electrode structure 13 includes separate control electrodes 131 and 132 for the first mesa 101 and the second mesa 102, and if, e.g., the two control electrodes 131 and 132 separated from each other by means of the insulation structure 133 (as exemplarily illustrated in FIGS. 3A-B, 5A, 9 and 17), the barrier zone 105 may also be omitted.

Figure 7B:
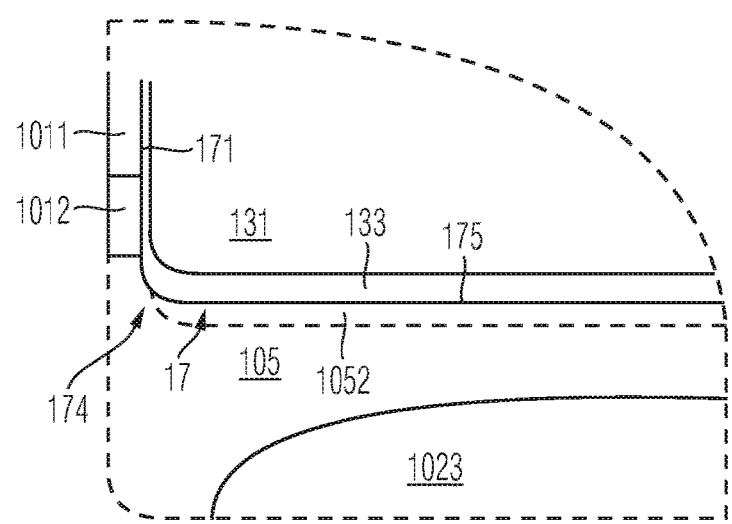

In an embodiment, as illustrated in FIG. 7B, a first thickness along the first lateral direction X of the insulation structure 133 between the first trench sidewall 171 and the first control electrode 131 amounts to less than a half of a second thickness along the vertical direction Z of the insulation structure 133 between the trench bottom 175 and the first control electrode 131. Hence, the insulation structure 133 can exhibit a greater thickness at the trench bottom 175 as compared to the region at the first trench sidewall 171. For example, in a transition subregion 174 of the trench structure 17, the trench bottom 175 and the first trench sidewall 171 merge with each other and the thickness of the insulator structure 133 increases, e.g., gradually, from the first thickness to the second thickness.

For example, the second thickness is even greater than twice the first thickness, e.g., at least three times as great, or even greater than four times the first thickness.

In accordance with an embodiment, the thickness of the insulation structure 133 along the entire course of the first control electrode 131 along the first lateral direction X outside the transition subregion 174 amounts to at least the second thickness. For example, the comparatively thick insulator (e.g., an oxide) at the trench bottom 175 allows for reducing an undesired capacitive coupling between the semiconductor body 10 and the first control electrode 131. It may further be appropriate to limit the second thickness; e.g., in terms of controllability, it may be appropriate to design the second thickness not greater than hundred times than the first thickness, e.g., smaller than 50 times or smaller than 20 times or smaller than 10 times the first thickness.

At shall be understood that such transition subregion 174 (e.g., as illustrated in FIG. 7B) may also be implemented at the embodiment schematically shown in FIG. 6 and that the transition subregion 174 may also be implemented at a transition between the trench bottom 175 and the second trench sidewall one 172.

For example, a gradual increase of the thickness of the insulation structure 133 in the transition subregion(s) 174 may yield a more robust operational behavior of the power semiconductor device 1, as an undesired impact of potential local increases of the electric field strength at or in proximity to the transition subregion(s) 174 can be avoided.

In addition or in alternative to the above described transition subregion 174, the first mesa 101 may exhibit a mesa opening with a width at least twice as large as its total extension (cf. reference numeral DX13) in the first lateral direction X. For example, the width of the mesa opening of the first mesa 101 is defined by the distance in the first lateral direction X between two adjacent trench bottoms 175 of the trench structure 17. This optional aspect is also schematically illustrated in FIG. 5A, namely by means of the dotted and bended course that link the trench sidewalls 171/172 to the trench bottoms 175. Thus, whereas the first mesa 101 may exhibit its width along the first lateral direction X of no more than 100 nm in a section of the first mesa 101 that entirely overlaps with the first control electrode 131 along the vertical direction Z, such maximum width may be increased at the mesa opening, e.g., at least by a factor of two.

For example, the mesa opening is formed by a corresponding curved course of the insulation structure 133; e.g., a radius defining the mesa opening amounts to at least three times, at least five times, or at least 10 times of the first thickness of the insulation structure 133 mentioned above.

In accordance with an embodiment, also the second mesa 102 may exhibit a corresponding mesa opening with a width at least twice as large as its total extension (cf. reference numeral DX23) in the first lateral direction X. In accordance with another embodiment, also the second mesa 102 may exhibit an opening which is formed by a corresponding curved course of the insulation structure 133; e.g., a radius defining the mesa opening amounts to at least three times, at least five times, or at least 10 times of the first thickness of the insulation structure 133 mentioned above.

As already indicated above, the barrier zone 105 may be provided between the guidance zone 1023 and the second channel region 1022. For example, the barrier zone 105 comprises said barrier subzone 1052 in contact with the trench bottom 175, wherein the barrier subzone 1052 has a dopant concentration at least as great as the dopant concentration of the drift region 100. The dopant concentration of the barrier subzone 1052 can be greater than twice the dopant concentration of the drift region 100; e.g., the dopant concentration of the barrier subzone 1052 may be greater than 50 times, greater than 500 times, 2000 times the dopant concentration of the drift region 100. For example, the dopant concentration of the barrier subzone 1052 amounts to at least $10^7$ cm$^{-3}$. Further, the barrier subzone 1052 may have a greater dopant concentration than the remaining portion of the barrier zone 105, i.e., the portion of the barrier zone 105 that is not the subzone 1052. Further, the barrier subzone 1052 may be in contact with the trench bottom 175 within the transition subregion 174. Thus, at the transition subregion 174 of the trench structure 17, there may be arranged a semiconductor region of the first conductivity type with a significantly increased dopant concentration.

For example, the barrier subzone 1052 is configured to prevent charge carriers of the second conductivity type to approach the trench button 175. For example, this allows for reducing an undesired capacitive coupling between the first control electrode 131 and semiconductor body 10.

In an embodiment, the barrier subzone 1052 exhibits a thickness of less than 100 nm. Whereas the barrier zone 105 may entirely laterally overlap with both the first mesa 101 and the second mesa 102, in an embodiment, the barrier subzone 1052 terminates at the transition subregions 174, i.e., in the region where the trench bottom 175 merges with the first trench sidewall 171 and/or in the region where the trench bottom 175 merges with the second trench sidewall 172.

The barrier zone 105 may not only be arranged between the guidance zone 1023 and the trench bottom 175, but may also laterally extend further, e.g., so as to entirely laterally overlap with the first mesa 101, as schematically illustrated in FIGS. 7A and 7B. But, in an embodiment, the barrier zone 105 does not extend further along the vertical direction Z as compared to the guidance zone 1023.

For example, the barrier subzone 1052 covers the trench bottom 175. In another embodiment, the barrier subzone 1052 may even at least partially laterally overlap with the first mesa 101. Or, as illustrated in most of the drawings, at least the barrier zone 105 at least partially laterally overlaps with the first mesa 101. For example, by providing an increased dopant concentration of dopants of the first conductivity type in the region below the first mesa 101, it may be avoided that charge carriers of the second conductivity type approach the region right below the first mesa 101.

For example, a transition along the vertical direction Z between the barrier zone 105 and the guidance zone 1023 forms an upper pn-junction 1051, and a transition along the vertical direction Z between the guidance zone 1023 and the drift region 100 forms a lower pn-junction 1001. For example, a distance along the vertical direction Z between the trench bottom 175 and the upper pn-junction 1051 amounts to at least 50 nm and to no more than 500 nm, wherein, depending on the configuration of the trench structure 17, such distance can also be significantly larger (cf., for example, FIG. 9). Hence, in an embodiment, the guidance zone 1023 does not contact the trench structure 17, but is separated therefrom by a semiconductor region of the first conductivity type, e.g., by the barrier zone 105. Further, the distance between the two pn-junctions 1051 and 1001, i.e., the maximum thickness of the guidance zone 1023 along the vertical direction Z, can be within the range of 300 nm to 5000 nm. However, as will become apparent from the explanations further below, such maximum thickness may vary along the first lateral direction X. Irrespective of whether or not the thickness varies, the maximum thickness of the guidance zone 1023 along the vertical direction Z can in any case amount to less than one tenth of the total extension of the semiconductor body 10 along the vertical direction Z.

For example, the maximum thickness of the guidance zone 1023 along the vertical direction Z can in any case be within the range of a factor of 0.5 to 10 of the total extension of the first mesa 101 along the vertical direction Z.

As has been explained above, the guidance zone 1023 may be separated from the second channel region 1022 by means of a semiconductor portion of the first conductivity type, e.g., by at least one of a section of the drift region 100 and a section of the barrier zone 105. The second channel region 1022 may form a pn-junction with said semiconductor portion of the first conductivity type, and the exemplary minimum distances and maximum distances between the guidance zone 1023 and the second channel region 1022 along the vertical direction Z, as mentioned above, may be the minimum distances and maximum distances between the pn-junction 1051 and the pn-junction formed between second channel region 1022 and at least said semiconductor portion of the first conductivity type (by at least one of a section of the drift region 100 and a section of the barrier zone 105).

Figure 15:
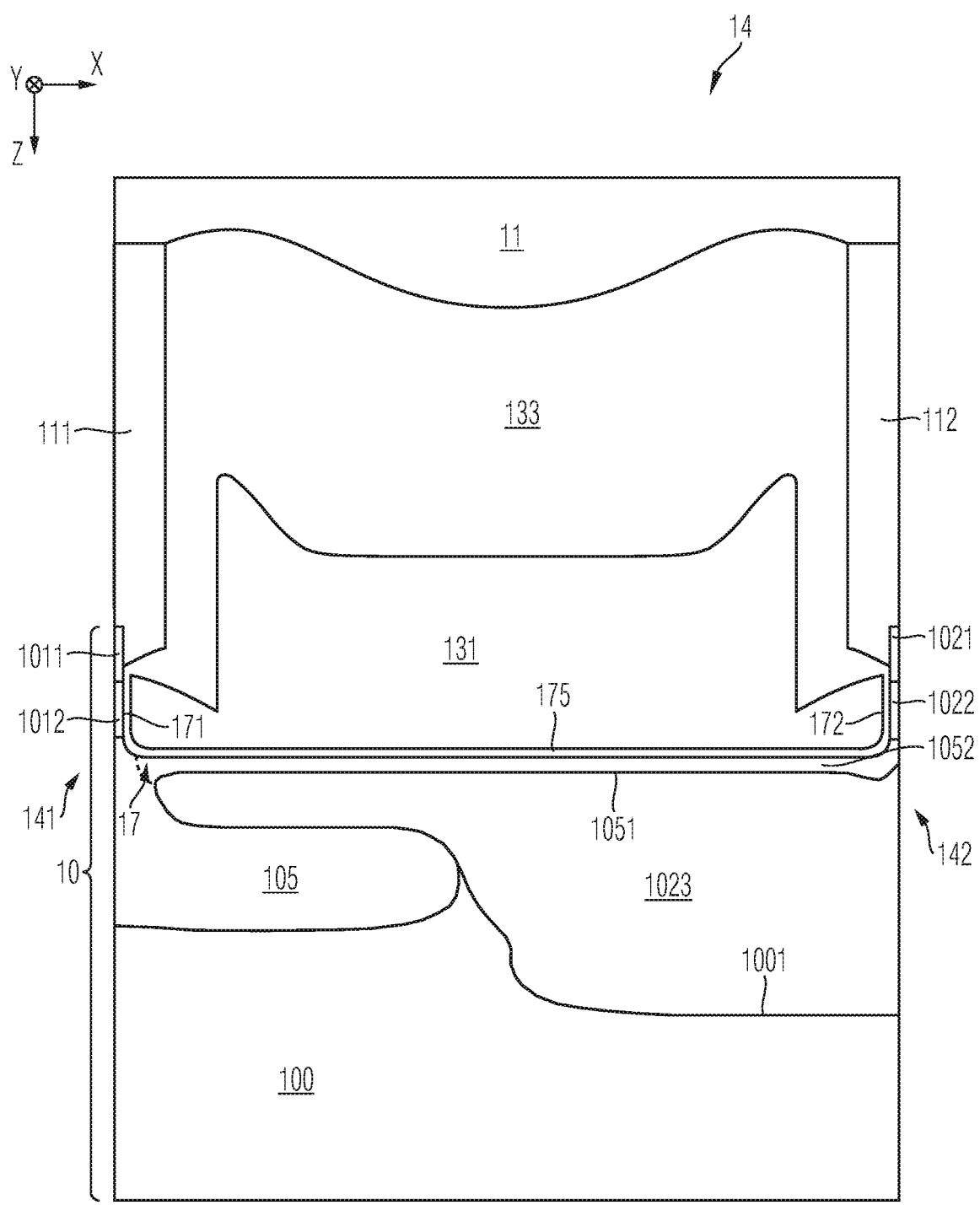

For example, regarding the embodiment schematically and exemplarily illustrated in FIG. 15, the thickness of the guidance zone 1023 can decrease by a factor of at least two while laterally extending towards the first mesa 101. Further the distance between the bottom of the trench structure 175 and the guidance zone 1023 may remain substantially constant while the guidance zone 1023 laterally extends towards the first mesa 101 and decreases in thickness. For example, the distance between the trench bottom 175 and the upper pn-junction 1051 does not change while the guidance zone 1023 extends towards the first mesa 101. However, the distance between the two pn-junctions 1051 and 1001 may decrease while the guidance zone 1023 extends towards the first mesa 101.

For example, such decrease of thickness forms a protrusion-like section of the guidance zone 1023, which may allow for a better control of the lateral end of the guidance zone 1023 in the lateral direction towards the first mesa 101 or opening DXmin of the guidance zone 1023 under the first mesa 101 as described above.

Such exemplary form of the guidance zone 1023 is also possible in case the control electrode structure 13 includes the two separate first and second control electrodes 131 and 132, as shown in FIG. 17.

As has already been indicated above, the guidance zone 1023 may yield an improved controllability of switching operations of the power semiconductor device 1.

For example, a connection between the second channel region 1022 and the guidance zone 1023 exhibits a first electric conductivity during a first operational state (e.g., the conducting state) of the power semiconductor device 1 and a second electric conductivity during a second operational state (e.g., the blocking state) of the power semiconductor device 1. The second electric conductivity can be greater than the first electric conductivity by a factor of at least ten. Thus, the current flow through the second channel region 1022, e.g., at least during a transition from the conducting state to the blocking state of the power semiconductor device 1, can be greater than the current flow through the second channel region 1022 during a conducting state of the power semiconductor device by a factor of at least ten. For example, thereby, the drainage of charge carriers of the second conductivity type (e.g., the second load current 152) can be increased shortly before and/or during a turn-off operation and/or during the blocking state of the power semiconductor device 1.

For example, during the transition from the first operational state to the second operational state, the electrical potential of the guidance zone 1023 deviates by at most 3 V, by at most 1.5 V or by even less than 0.5V from the electrical potential of the first load terminal structure 11. In an embodiment, this voltage difference is caused along the path between the upper pn-junction 1051 and the second channel region 1022.

Further, in an example, during the blocking state of the power semiconductor device 1 and/or during a transition from the conducting state to the blocking state, the guidance zone 1023 is configured to guide, along a path between the first mesa 101 and the second mesa 102, at least one of charge carriers of the second conductivity type and an electrical potential different from the electrical potential of the second channel region 1022 by at least 50 mV and less than 3 V. This voltage range may also be chosen differently, depending on the application, e.g., it is within 50 mV to 3 V, or within 100 mV to 1.5 V, or within 150 mV to 500 mV. Again, in an embodiment, this voltage difference is caused along the path between the upper pn-junction 1051 and the second channel region 1022, which may entirely be formed a semiconductor portion of the first conductivity type, e.g., by at least one of a section of the drift region 100 and a section of the barrier zone 105, as explained above.

Regarding all embodiments described above, it shall be understood that both the first channel region 1012 and the second channel region 1022 can be of the second conductivity type. Thus, both the first channel region 1012 and the second channel region 1022 may form a respective pn-junction with a semiconductor region of the first conductivity type arranged below, e.g., either with the drift region 100 or with the barrier zone 105.

As indicated above, the control electrode structure 13 may comprise a separate control electrode for each cell portion 141 and 142. For example, as illustrated in each of FIG. 8A-D, the first control electrode 131 is associated with the first mesa 101, wherein the second control electrode 132 is associated with the second mesa 102. The control electrodes 131 and 132 can not only be arranged separately from each other, but also differ from each other in at least one of a relative position to the associated mesa 101/102, in dimension and in material. The first control electrode 131 is configured for controlling at least the first mesa 101, and the second control electrode 132 is configured for controlling at least the second mesa 102.

For example, in accordance with the embodiment schematically illustrated in FIG. 8A, the control electrodes 131 and 132 are arranged separately from each other, but do not differ from each other with respect to the relative position with respect to the associated mesa 101/102. For example, this may yield a symmetrical arrangement of the first cell portion 141 and the second cell portion 142 with in the cell. The control electrodes 131 and 132 may be separated from each other by means of the insulation structure 133. The guidance zone 1023 may for example entirely overlap with the second control electrode 132 associated with the second mesa 102, and, e.g., only partially overlap with the first control electrode 131 associated with the first mesa 101 in the first lateral direction X. If present, the barrier subzone 1052 may laterally overlap with both control electrodes 131, 132 in the first lateral direction X.

As has also further been indicated above, both control electrodes 131, 132 may be supplied with the identical control signal; for example, the first control electrode 131 may be electrically connected to the second control electrode 132. In another embodiment, the control electrodes 131 and 132 are electrically insulated from each other and may hence be supplied with individual control signals, e.g., a driver (not illustrated) is configured to provide the first control signal to the first control electrode 131 and a second control signal to the second control electrode 132. The latter variant may allow for a more flexible control scheme, but also requires a corresponding driver configuration.

In a further embodiment, the first control electrode 131 and the second control electrode 132 may be connected to each other by means of a defined ohmic resistance. Then, a single control signal may be provided to both electrodes, wherein the such single control signal may cause a dynamic voltage difference between the first control electrode 131 and the second control electrode 132 during switching and the same voltage at both electrodes during static on-state (also referred to as conducting state herein) and static off-state (also referred to as blocking state herein).

In accordance with an embodiment, the second mesa 102 exhibits a greater total extension range along the first lateral direction X (i.e., a greater width) as compared to the first mesa 101. This optional aspect is also illustrated in FIGS. 8A and 8C, wherein, the width of the second mesas 102 may for example be greater than twice the width of the first mesa 101. In accordance with another embodiment and as schematically illustrated in FIG. 8D, the second mesa 102 may exhibit a smaller total extension range along the first lateral direction X (i.e., a smaller width) as compared to the first mesa 101. Optionally, the first mesa 101 may also exhibit a contact doping portion 1019 shown by the dotted line in FIG. 8D.

Figure 8B:
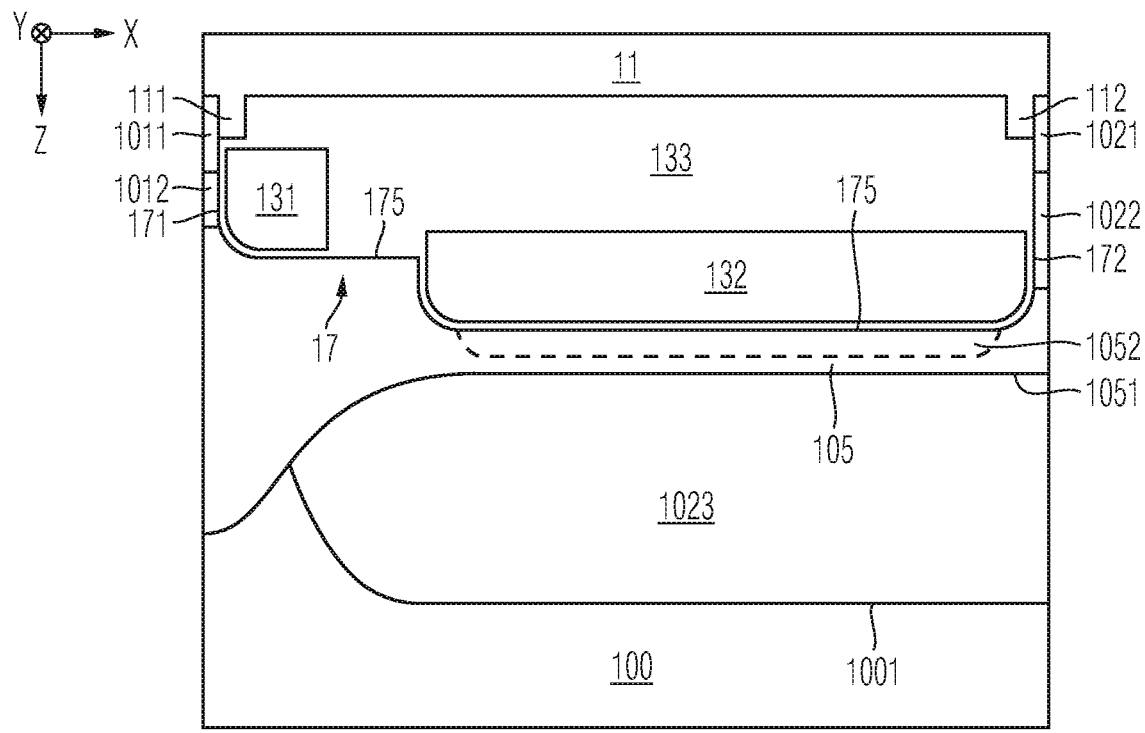
Figure 8C:
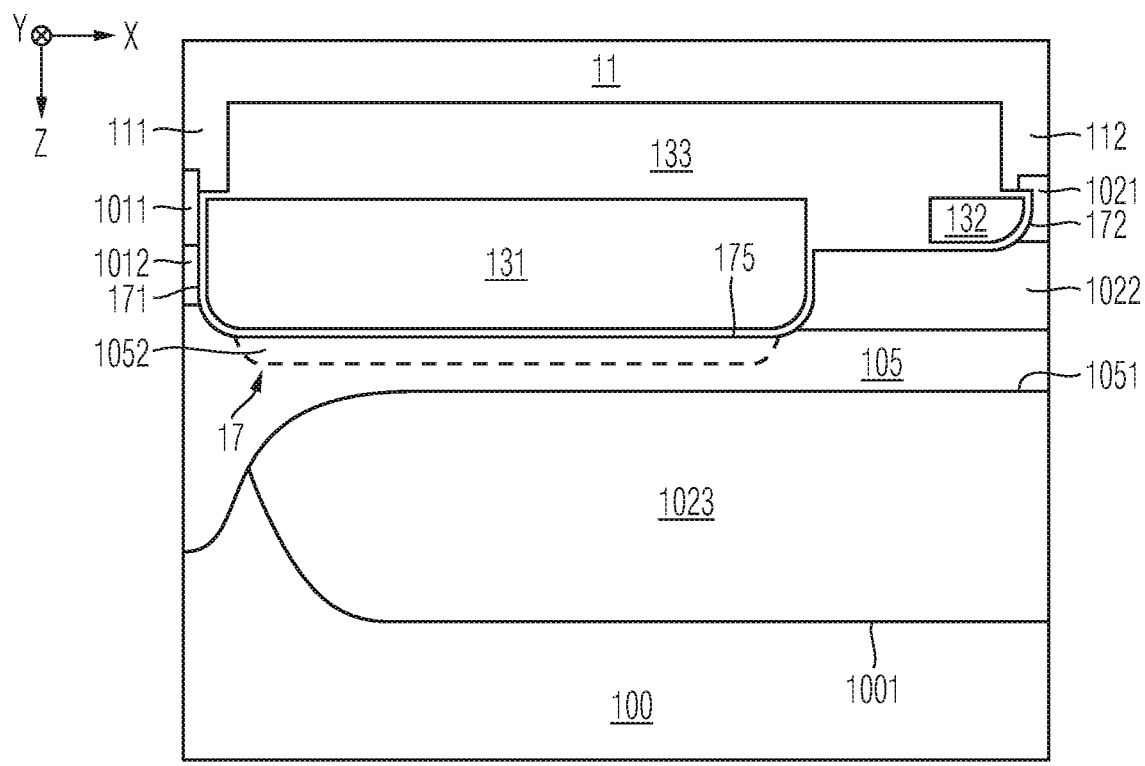
Figure 8D:
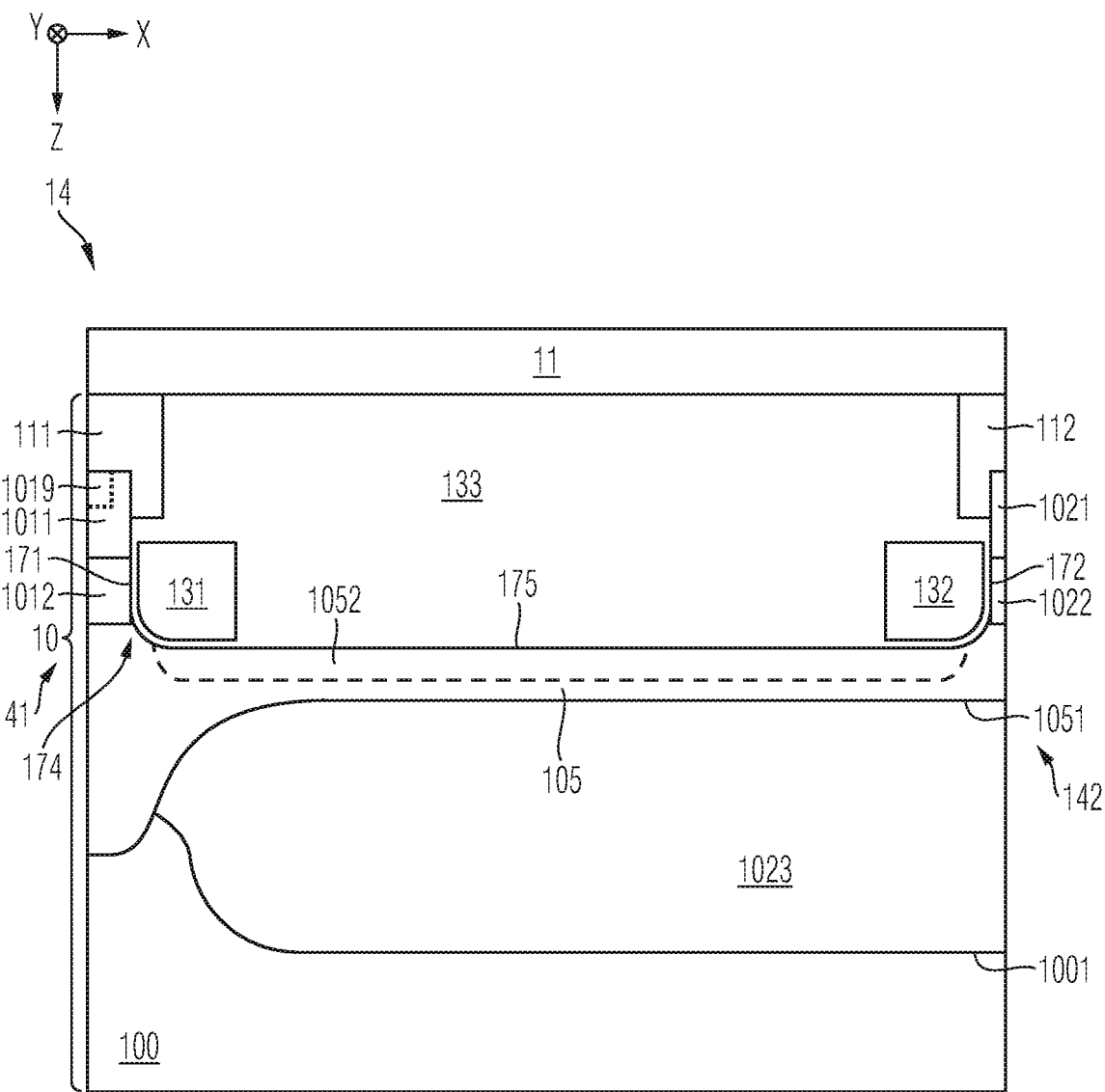

As illustrated in FIGS. 8B-D, providing separate control electrodes 131 and 132 may allow for designing the cell 14 in accordance with an asymmetrical design. For example, one of the first control electrode 131 and the second control electrode 132 may extend further along the vertical direction Z as compared to the other control electrode. For example, thereby, the first mesa 101 may exhibit a different total extension along the vertical direction Z as compared to the second mesa 102, e.g., shorter one (cf. FIG. 8A).

For example, the control electrode that is arranged deeper as compared to the other control electrode may have a larger total extension along the first lateral direction X. For example, if present, the barrier subzone 1052 laterally overlaps only with the control electrode arranged deeper than the other. Manufacturing of the trench 17 for the first control electrode 131 and second control electrode 132 (having, e.g., different spatial configurations) may include one or more dry etching processes (e.g., RIE—reactive ion etch), wherein the etching speed in the vertical direction Z may depend on the opening of a mask defining the width of the trench 17. Thus, different wide openings may lead to different deeply etched trenches with larger mask openings leading to deeper trenches as shown in FIGS. 8B-C.

Figure 11A:
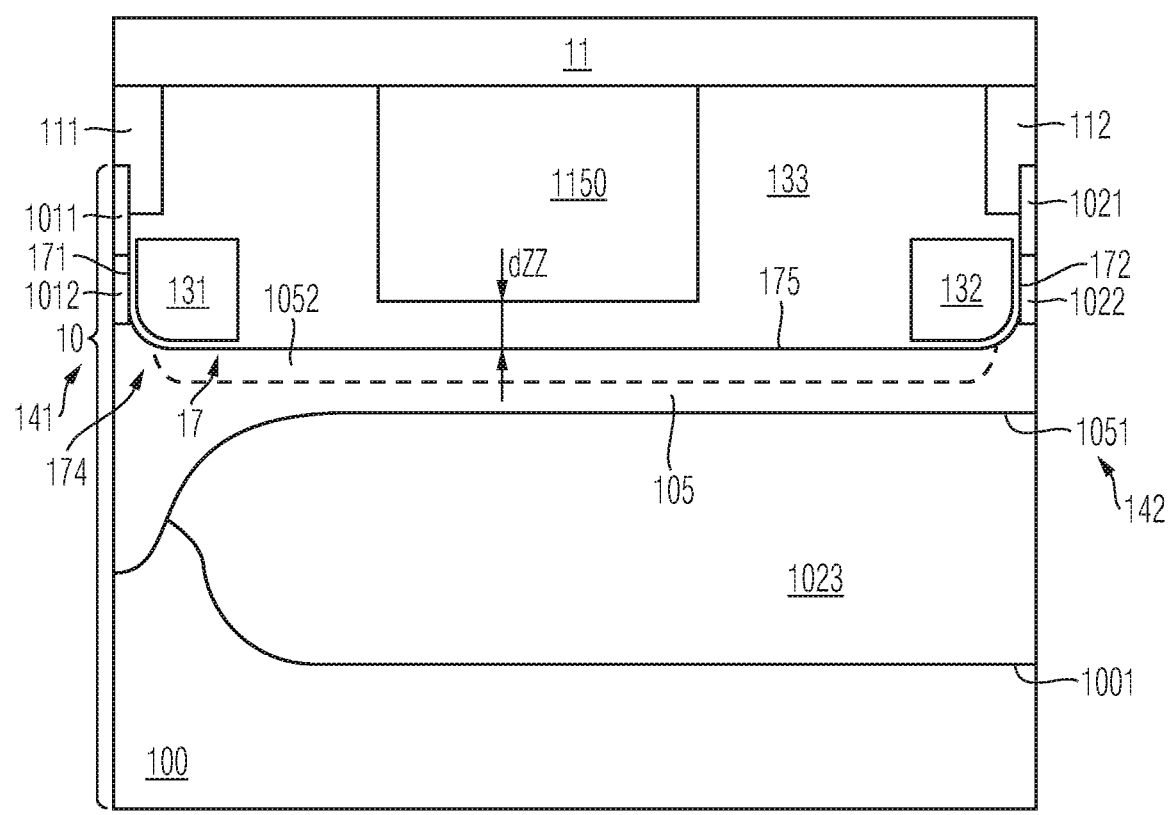
Figure 11B:
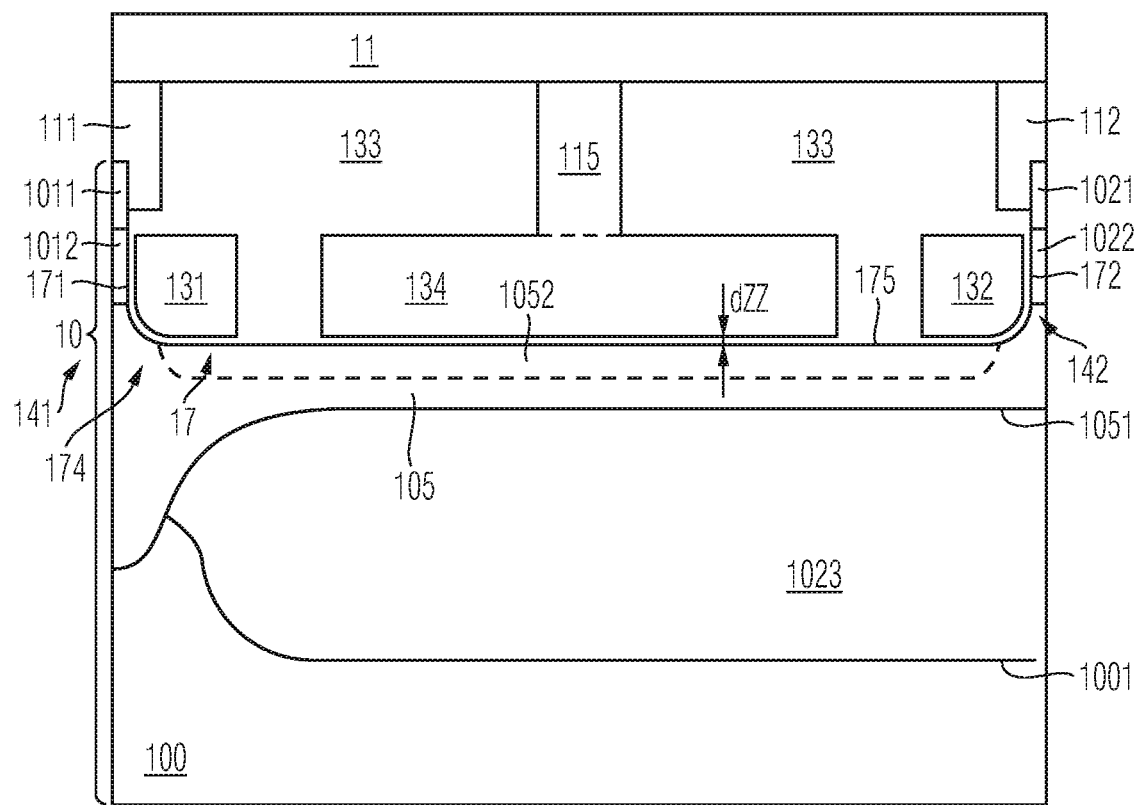

In accordance with the embodiment schematically and exemplarily illustrated in FIGS. 11A-B, the trench structure 17 may further include a source electrode 1150 that is electrically insulated from the control electrode structure 13 (e.g., from both the first control electrode 131 and the second control electrode 132) and electrically connected to the first load terminal structure 11 by means of a further contact plug 115. As illustrated in FIG. 11A, the further plug 115 may form a part of the source electrode 1150. For example, the source electrode 1150 is implemented as a trench electrode. For example, it may be arranged between the first control electrode 131 and the second control electrode 132. In an embodiment, the source electrode 1150 laterally overlaps with the guidance zone 1023, wherein the insulation structure 133 may exhibit, in a region where such overlap is present, a minimum thickness dZZ of at least 50 nm.

For example, the distance between the source electrode 115 and the trench bottom 175 is greater than the distance between the first control electrode 131 and the trench bottom 175. In an embodiment, the source electrode 115 laterally overlaps along its entire extension with the guidance zone 1023 in the first lateral direction X. If present, the source electrode 115 may further laterally overlap along its entire extension with the barrier zone 105 in the first lateral direction X or, if present, with the barrier subzone 1052 in the first lateral direction X.

In an embodiment, as illustrated in FIG. 11B, a trench electrode structure may be laterally patterned so as to obtain the first control electrode 131, the control electrode 132 (both having the functionalities as described above), and the source electrode 1150 which may be electrically connected to the first load terminal structure 11 (cf. contact plug 115). For example, the insulation structure 133 may exhibit the minimum thickness dZZ between the source electrode 1150 and the trench bottom 175 of at least twice the thickness or three times the thickness or four times the thickness of the insulation structure 133 in the first lateral direction between one of the first control electrode 131 (or second control electrode 132) and the first mesa 101 (or second mesa 102); e.g., at least twice the first thickness mentioned above.

In a yet further embodiment, the electrode 1150 is not electrically connected to the first load terminal structure 11, but to another electrical potential or, respectively, the electrode 1150 is electrically floating.

In accordance with an embodiment, each cell 14 may comprise more than one first mesa 101 and/or more than one second mesa 102. For example, referring to FIG. 12, the number of second mesas 102 included in each cell 14 may be greater than the number of first mesas 101. For example, each cell 14 comprises only one first mesa 101 and two or more second mesas 102. E.g., in such case, the guidance zone 1023 laterally overlaps along the first lateral direction X with each of the second mesas 102, as illustrated in FIG. 11. Further, if present, the barrier zone 105 may comprise more than one barrier subzone 1052, e.g., below each trench bottom 175. For example, no lateral overlap is formed between the barrier subzones 1052 and the first and second mesas 101, 102.

For example, the ratio between the number of first mesas 101 and the number of second mesas 102 can be chosen in dependence of a desired switching behavior. For example, if a faster turn-off operation is desired, the number of second mesas 102 may be increased.

For controlling the second mesa 102, the separate second control electrode 132 may be provided within the trench structure 17. However, it shall be noted, as explained above, that the second control electrode 132 need not necessarily be electrically insulated from the first control electrode 131.

Figure 12:
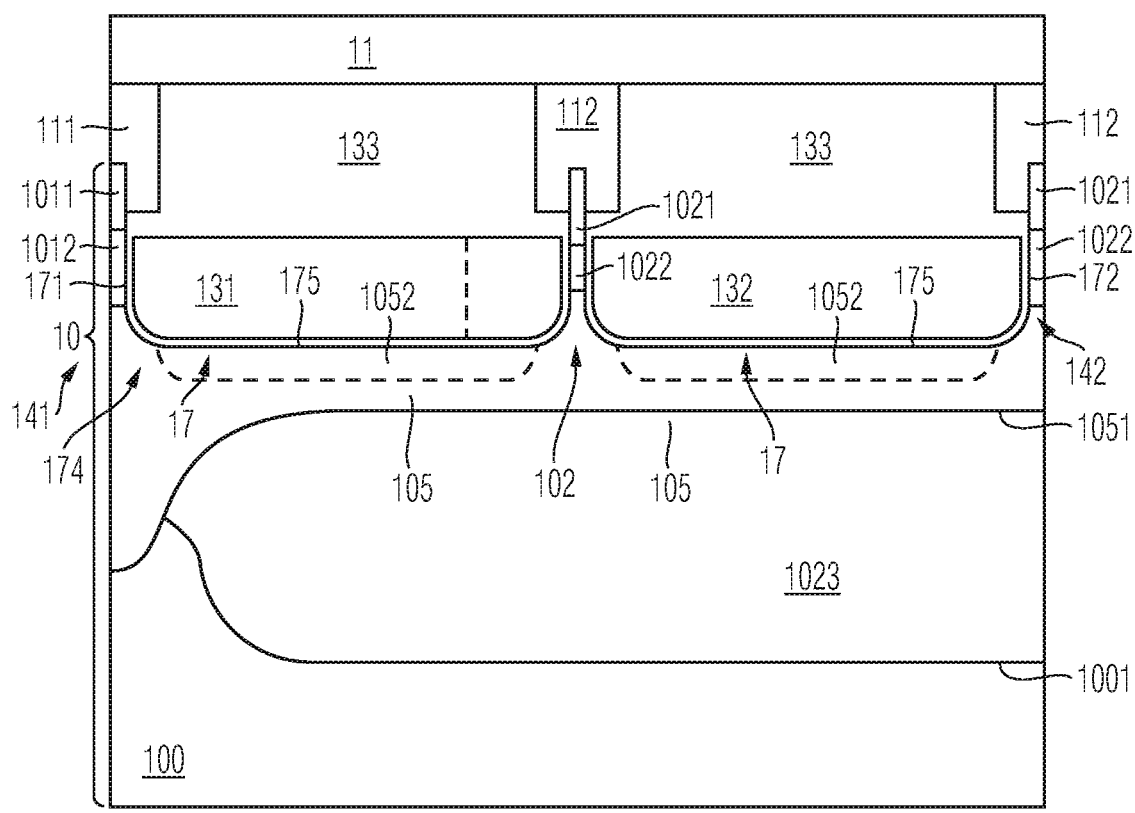

The example in FIG. 12 shows the additional second mesa 102 that is controlled from one side by the first control electrode 131 and from the other side by the second control electrode 132. The additional second mesa 102 may (in case the control electrodes 131 and 132 are differently configured and/or provided with different control signals) exhibit another control characteristic as the second mesa 102 that is exclusively controlled by means of two second control electrodes 132 (one on each side). However, as indicated by the dashed line, the (joint) control electrode 131 on the left side of the additional second mesa 102 could be separated into the first control electrode 131 for controlling the first mesa 101 and the second control electrode 132 for controlling the additional second mesa 102 in the same way as the second mesa 102. Said control electrode separation may be achieved at least by providing a dummy mesa, as will be explained in more details with respect FIGS. 13-14.

But, as explained above, irrespective of an eventual spatial separation of control electrodes 131, 132, operation of the power semiconductor device may nonetheless be controlled by means of single control signal provided to the control electrode structure 13. E.g., the second control electrode 132 may be electrically connected to the first control electrode 131 or, respectively, coupled thereto by means of a defined ohmic resistance.

Figure 13:
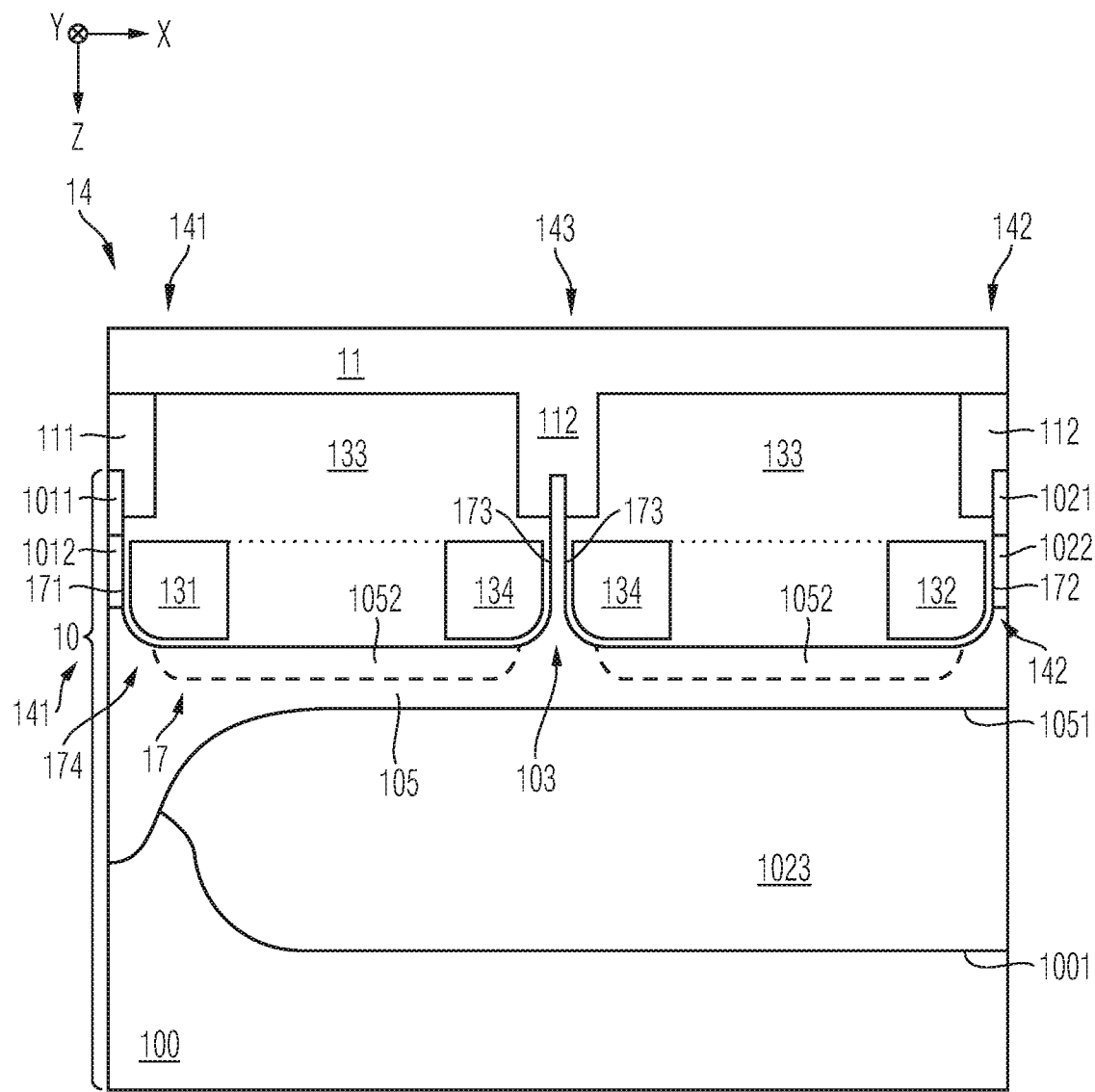

In accordance with an embodiment, each cell 14 may comprise a third cell portion 143, e.g., between the first cell portion 141 and the second cell portion 142, as illustrated in FIG. 13. For example, the third cell portion 143 includes a third mesa 103. The third mesa 103 may be laterally confined by third trench sidewalls 173 of the trench structure 17. The third mesa 103 may, e.g., exhibit the same spatial dimensions as the first mesa 101 or as the second mesa 102. For example, the third mesa 103 is a dummy mesa, i.e., a mesa configured to not conduct a load current or a portion thereof. To this end, the third mesa 103 is for example not electrically connected to the first load terminal structure 11. As shown, no contact plug is provided that would establish an electrical connection between the third mesa 103 and the first load terminal structure 11. Additionally or alternatively, a transition between the third mesa 103 and the first load terminal structure 11 may be configured to not provide for a conductive path for a load current portion; e.g., rather, the transition between the third mesa 103 and the first load terminal structure 11 may be configured to provide for an electrical isolation.

For example, the third mesa 103 is entirely filled with a semiconductor material of the first or the second conductivity type. If present, the barrier zone 105 may extend into the third mesa 103, as illustrated in FIG. 13.

As a dummy mesa, there is no need to control the third mesa 103. Nevertheless, e.g., for reasons of a uniform process and/or for symmetry reasons, the control electrode structure 13 may also extend into proximity of the third mesa 103, e.g., by means of one or more additional third electrodes 134, 134' or (as indicated by the dotted line) by a section of a respective first (joint) control electrode 131. Hence, for example, each cell 14 may comprise two first control electrodes 131, wherein one of these is associated with both the first mesa 101 and the third mesa 103 and the other one is associated to both the second mesa 102 and the third mesa 103. The third electrodes 134, 134' alternatively may be electrically connected to one or more of the first control electrodes 131, to the second control electrodes 132 or to the first load terminal structure 11.

Figure 14:
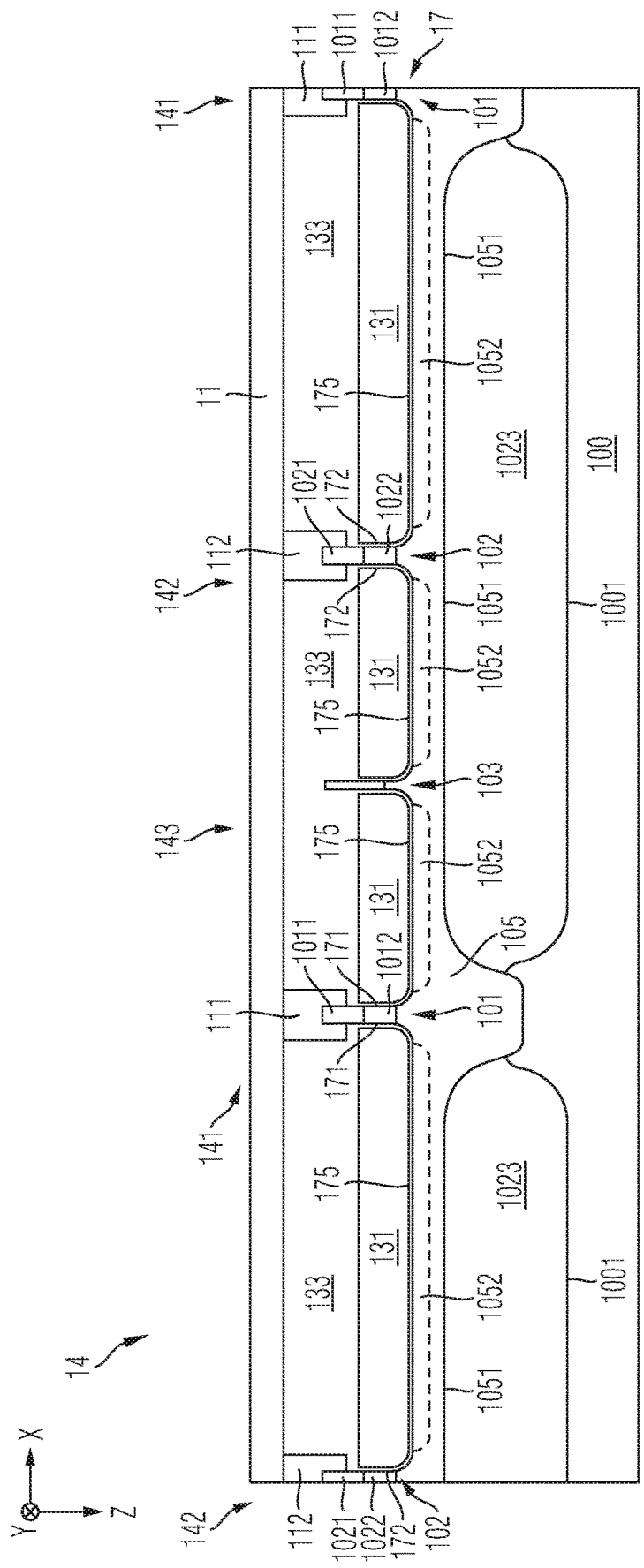

Additionally or alternatively, the third mesa 103 may be employed for separating the control electrode structure 13, e.g., into the first control electrode 131 and the second control electrode 132, which will also be explained in more detail with respect to FIG. 14.

For example, the guidance zone 1023 also laterally overlaps with the third mesa 103 along the first lateral direction X, e.g., so as to approach the first mesa 101 but without laterally overlapping therewith, as explained above. Regarding the plurality of barrier subzones 1052, which may optionally be provided, it is referred to the explanations above which may analogously apply to the embodiment illustrated in FIG. 13.

For example, the ratio between the number of first mesas 101, the number of second mesas 102 and the number of third mesas 103 in each cell can be chosen in dependence of a desired capacitive behavior of the device 1. Equipping each or some of the cells 14 with the third mesa 103 may allow for adjusting a capacitance of the device, e.g., the capacitances or the ratio of the capacitances between the first control electrode 131, the second control electrode 132 and the third electrodes 134, 134' with respect to the first load terminal structure 11 and the second load terminal structure 12.

With reference to FIG. 14 another exemplary embodiment of the cell 14 shall be elucidated. As illustrated, the cell 14 may comprise two first cell portions 141 and two second cell portions 142, wherein the two first cell portions 141 and the two second cell portions 142 may be separated from each other by one (or more) third cell portion(s) 143. The cell portions 141, 142 and 143 may be configured in a manner as has exemplarily been explained with respect to the foregoing drawings. In this embodiment, both pairs of the first mesa 101 at the second mesa 102 are controlled by means of the respective first (joint) control electrode 131. The central third cell portion 143 with the third (dummy) mesa 103 separates the central first mesa 101 and the central second mesa 102 from each other. For example, each cell portion 141, 142 and 143 exhibits the same total extension in the first lateral direction X.

In accordance with an embodiment, the distance along the first lateral direction X between the first mesa 101 and the second mesa 102 is greater than the distance between the first mesa 101 and the third mesa 103. For example, the distance along the first lateral direction between the first mesa 101 and the second mesa 102 amounts to twice of the distance between the first mesa 101 and the third mesa 103. Analogously, also the distance along the first lateral direction X between the first mesa 101 and the second mesa 102 may amount to at least twice of the distance between the second mesa 102 and the third mesa 103. The lateral widths in the first lateral direction X of the first mesa 101, the second mesa 102 and the third mesa 103 may be substantially equal, e.g., by using the same process technology. However, for example, the third mesa 103 when realized as a dummy mesa may have a different (e.g., larger or smaller width) as compared to the first mesa 101 and/or the second mesa 102. According to an embodiment, the lateral width of the third mesa 103 may larger by a factor of e.g. ten or more than the first mesa 101 or the second mesa 102.

If multiple first and/or second and/or third cell portions 141, 142, 143 are present, each cell 14 may accordingly also comprise multiple guidance zones 1023, as illustrated in FIG. 14. Whereas the barrier zone 105 may be a contiguous zone that is shared by a plurality or, respectively, by all cells 14 of the active cell field 16, the different guidance zones 1023 may be separated from each other. In another embodiment, it is for example possible that the different guidance zones 1023 merge together somewhere in the semiconductor body 10, e.g., within the edge termination zone 18. The semiconductor section separating adjacent guidance zones 1023 from each other may laterally overlap with the first mesas 101 and may be filled by at least one of the section of the drift region 100 and a section of the barrier zone 105, as has already been elucidated above in greater detail.

Further, if multiple first and/or second and/or third cell portions 141, 142, 143 are present, and if each cell 14 hence comprises two or more first mesas 101, it can be possible to associate a first one of the first mesas 101 with the first control electrode 131, and a second one of the first mesas 101 with the second control electrode 132. This optional aspect yields the possibility to control a first portion of the plurality of the first mesas 101 differently than a second portion of the plurality of the first mesas 101. For example, the third cell portion 143 including the third mesa 103 may be employed for separating the control electrode structure 13 accordingly. In another embodiment, it may be desirable to control all first mesas 101 by means of control electrodes electrically connected to each other, e.g., only by means of the first control electrodes 131, as illustrated in FIG. 14.

In accordance with all embodiments described herein, the cut-off voltage of the accumulation channel in the second channel region 1022 can be greater than the cut-off voltage of the conductive channel in the first channel region 1012. For example, the difference in the cut-off voltages may amount to at least 0.2 V. In an embodiment, the cut-off voltage of the conductive channel is less than 0.8 V, and the cut-off voltage of the accumulation channel is greater than 1.0 V.

Generally speaking, the difference in the cut-off voltages may allow for achieving a more flexible control of device 1, e.g., of the second channel region 1022, e.g., during the conducting state of the semiconductor device 1, e.g., in a manner that prevents charge carriers of the second conductivity type leaving the semiconductor body 10 via the second mesa 102 of the second cell portion 142 during the conducting state and/or in a manner that allows for draining charge carriers of the second conductivity type out of the semiconductor body 10 via the second mesa 102 of the second cell portion 142 shortly before switching the semiconductor device 1 into the blocking state.

In the following, some exemplary ways of achieving such difference between the cutoff voltages shall be explained in more detail:

In an embodiment, as exemplarily illustrated in the previous drawings, e.g., in FIGS. 3A, 3B, 5A, 8A-D, 11, 13, and 17, the semiconductor device 1 may comprise the first control electrode 131 and the second control electrode 132, the first control electrode 131 being configured to induce the conductive channel within the first channel region 1012, wherein the insulation structure 133 may insulate the first control electrode 131 from the first mesa 101. The second control electrode 132 can be configured to induce said accumulation channel, wherein the insulation structure 133 may further insulate the second control electrode 132 from the second mesa 102. The first control electrode 131 and the second control electrode 132 may be arranged separately from each other, as illustrated in the aforementioned drawings. For example, the material of the first control electrode 131 may differ from the material of the second control electrode 132 so as to achieve or, respectively, contribute to said difference between the cut-off voltages. To this end, the first control electrode 131 may exhibit a work function different from the work function of the second control electrode 132. Said difference between the work functions may amount to, e.g., at least 0.4 eV. For example, the second control electrode 132 exhibits a work function of less than 4.5 eV, and the first control electrode 131 may exhibit a work function of greater than, e.g., 4.9 eV. For example, to achieve a difference between the work functions, in an embodiment, the first control electrode 131 comprises at least one of a polycrystalline semiconductor material having dopants of the second conductivity type, a metal silicide (like e.g., $PtSi_2$ or $MoSi_2$), a metal nitride (like e.g., $WN_x$ or TiN), nickel, palladium, iridium, platinum and gold; and the second control electrode 132 comprises at least one of a polycrystalline semiconductor material having dopants of the first conductivity type, a metal silicide (like e.g., $TiSi_2$, $TaSi_2$ or $NbSi_2$), a metal nitride (like e.g., TaN or TiN), aluminium, titanium, magnesium, scandium, yttrium, rubidium, selenium and strontium. The work function of TiN as gate electrode may be adapted by a surface treatment at the transition zone to the gate dielectric which may make it useful for both the first and the second control electrode 131, 132. Whereas the two control electrodes 131 and 132 can be arranged separately and can be provided with different work functions, it shall be understood that the two control electrodes 131 and 132 can be electrically connected to each other and thus receive the same control signal, in accordance with one or more embodiments. For example, in contrast to the suggestion of the schematic illustration in some drawings, e.g., in FIGS. 3A, 3B, 5A, and 6, it shall be understood that the two control electrodes 131 and 132 need not necessarily be electrically insulated from each other.

In a further embodiment, either additionally or alternatively to providing the two separate control electrodes 131 and 132 with different work functions, the difference between the cut-off voltages may also be caused or, respectively, achieved by providing the first control electrode 131 with a work function greater than the work function of the first channel region 1012. Further, in addition or as an alternative, the second control electrode 132 may be provided with a work function that is smaller than the work function of the second channel region 1022. Each of the first channel region 1012 and the second channel region 1022 may comprise at least one of a monocrystalline semiconductor material having dopants of the second conductivity type and a titanium nitride (TiN). For example, each of the first channel region 1012 and the second channel region 1022 may exhibit a work function within a range of 4.6 eV to 5.0 eV.

In a yet further embodiment, the difference between the cut-off voltages may also be caused by providing each of the first channel region 1012 and the second channel region 1022 with dopants of the second conductivity type, wherein the dopant concentration of the first channel region 1012 can be smaller than the dopant concentration of the second channel region 1022 by factor of at least 2, a factor of 3 or a factor of 5. For example, in this embodiment with different dopant concentrations in the channel regions 1012 and 1022, the effective thickness, e.g., in the first lateral direction X (cf. e.g., DX12, DX14 in FIG. 5A), of the insulation structure 133 insulating the first control electrode 131 from the first channel region 1012 may be identical to the effective thickness, e.g., in the first lateral direction X (cf. e.g., DX22, DX24 in FIG. 5A), of the insulation structure 133 insulating the second control electrode 132 from the second channel region 1022. Further in this embodiment, the first control electrode 131 and the second control electrode 132 may be identical in material and/or in spatial dimensions or, respectively, the first mesa 101 and the second mesa 102 may be controlled by a joint control electrode.

According to a yet further example, the difference between the cut-off voltages may also be caused by providing the insulation structure 133 such that the effective thickness, e.g., in the first lateral direction X (cf. e.g., DX12, DX14 in FIG. 5A), of the insulation structure 133 insulating the first control electrode 131 from the first channel region 1012 is smaller than the effective thickness, e.g., in the first lateral direction X (cf. e.g., DX22, DX24 in FIG. 5A), of the insulation structure 133 insulating the second control electrode 132 from the second channel region 1022 by a factor of at least 20% or at least 30% or at least 50%. Thus, a variation of said thickness may accordingly vary the respective cut-off voltages of the conductive channel and the accumulation channel. Herein, the comparison of the "effective thicknesses" may mean that the product of the dielectric constant of the dielectric used for the insulation structure 133 insulating the first control electrode 131 from the first channel region 1012 multiplied with its thickness is compared to the product of the dielectric constant of the dielectric used for the insulation structure 133 insulating the second control electrode 132 from the second channel region 1022 multiplied with its thickness. In case said dielectrics being made of the same material, e.g., a silicon dioxide, this reduces to a comparison of the respective thicknesses. In case e.g., the dielectric used for the insulation structure 133 insulating the first control electrode 131 from the first channel region 1012 has a higher dielectric constant, the thickness may be even the same or even bigger than that for insulating the second control electrode 132 from the second channel region 1022.

According to a yet further example, the difference between the cut-off voltages may be achieved by providing a different density of interface charges of the insulation structure 133 such that the interface charge, e.g. of the insulation structure 133 insulating the first control electrode 131 from the first channel region 1012 may be more positive than the interface charge, e.g. of the insulation structure 133 insulating the second control electrode 132 from the second channel region 1022 by a factor of at least 20% or at least 30% or at least 50%. Different interface charges may e.g. be accomplished by different materials for both insulation structures 133 at the first channel region 1012 and the second channel region 1022, e.g., using a silicon nitride or a nitride silicon oxide as dielectric at the first channel region 1012 and a silicon dioxide at the second channel region 1022.

It shall be understood that the first mesa 101 and the second mesa 102 can be controlled by a single control signal, in accordance with one or more embodiments. To this end, there may be provided said two separately arranged control electrodes 131 and 132, as exemplarily illustrated in some the drawings, and said two separately arranged control electrodes 131 and 132 may be electrically connected to each other. In accordance with another embodiment, as exemplarily illustrated some of the drawings, each of the first mesa 101 and the second mesa 102 can be controlled by a joint control electrode, and in the above also referred to as first control electrode 131, that can, e.g., be monolithically integrated within the trench structure 17. Thus, it shall be understood that the difference in said cut-off voltages does not necessarily require at least two separate control electrodes for controlling the first mesa 101 and the second mesa 102.

Figure 9:
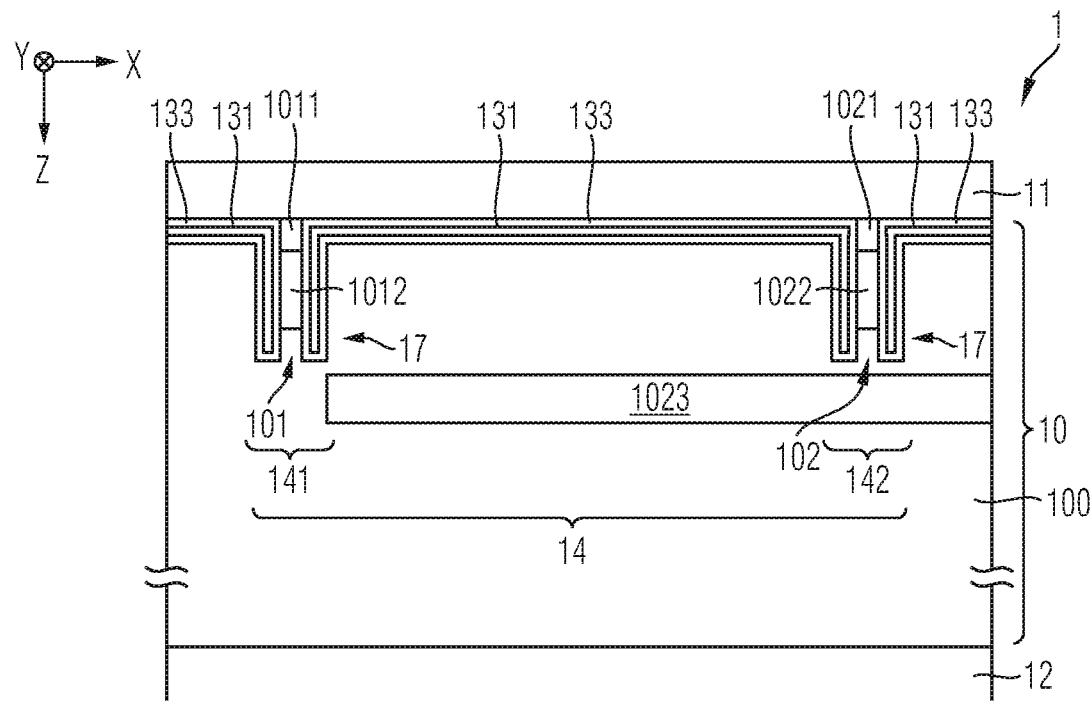
Figure 10:
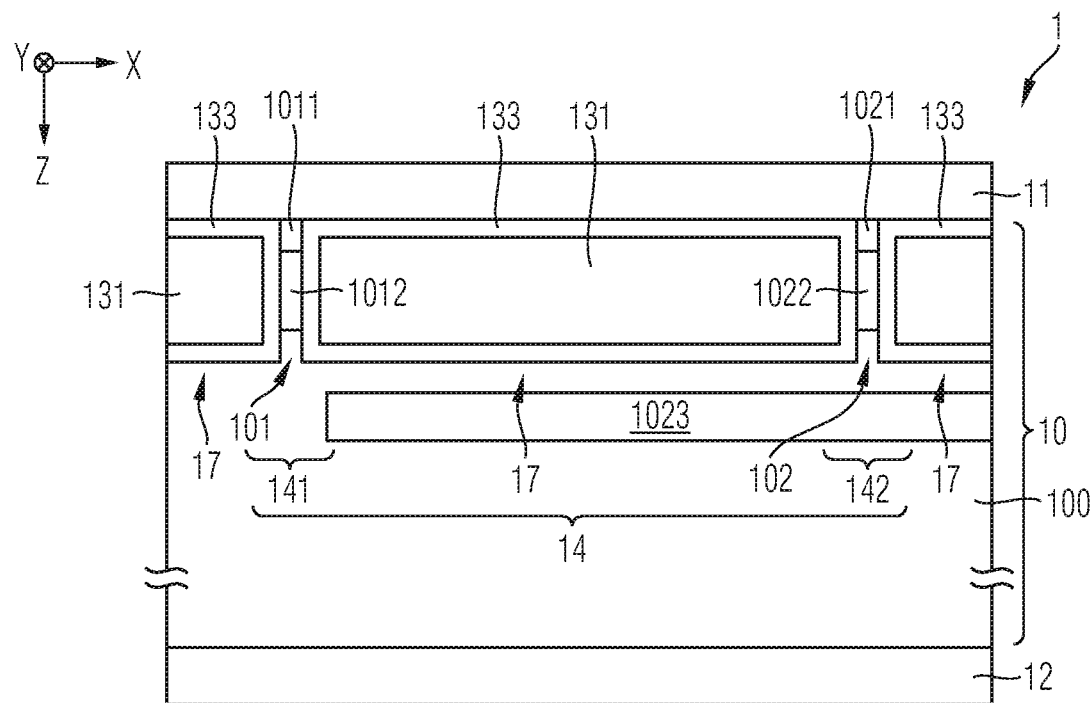

Further, as exemplarily illustrated in FIG. 9, it shall be understood that the insulation structure 133 need not necessarily extend at least as far in the vertical direction Z as the first control electrode 131 along the entire distance (c.f. DX30 in FIG. 5A) between the first mesa 101 and the second mesa 102, but may extend less in the vertical direction Z, e.g., being in the same range as the total extension of the first port region 1011 or, respectively, the total extension of the second port region 1021 in the vertical direction Z (c.f. e.g. DZ13, DZ23 in FIG. 5A), e.g., along at least 80% of the distance between the first mesa 101 and the second mesa 102. For example, if implemented as a joint control electrode, the first control electrode 131 may exhibit a U-shaped vertical cross-section. In another embodiment, a schematically and exemplarily illustrated in FIG. 10, the first control electrode 131 can be implemented as a block exhibiting a substantially constant total extension in the vertical direction Z along at least, e.g., 80% of the distance between the first mesa 101 and the second mesa 102.

An exemplarily method of operating such power semiconductor device (that provides an inversion channel and an accumulation channel with different cut-off voltages) is described in German patent application DE 10 2016 112 017.0, the relevant content of which is herein incorporated in its entirety.

Presented herein is also a method of processing a power semiconductor device. In accordance with some embodiments, the power semiconductor device to be processed has a semiconductor body to be coupled to a first load terminal structure and a second load terminal structure, the semiconductor body being configured to conduct a load current and comprising a drift region of a first conductivity type, wherein the power semiconductor device includes a plurality of cells. Each cell comprising: a first mesa included in a first cell portion, the first mesa including: a first port region of the first conductivity type being electrically connected to the first load terminal structure, and a first channel region being coupled to the drift region; a second mesa included in a second cell portion, the second mesa including: a second port region of a second conductivity type and being electrically connected to the first load terminal structure, and a second channel region being coupled to the drift region; a trench structure including a control electrode structure for controlling the load current at least by means of a conductive channel in the first channel region. The method comprises at least one of a) providing the first mesa with a total extension of less than 100 nm in a lateral direction perpendicular to a vertical direction of the load current part within the first mesa; and providing a guidance zone of the second conductivity type arranged below the second channel region while being spatially displaced from both the first and the second channel region along the vertical direction, wherein the guidance zone laterally overlaps with the second mesa and laterally extends towards the first mesa while not laterally overlapping therewith;

b) providing a guidance zone of the second conductivity type arranged below the second channel region, wherein the guidance zone laterally overlaps with the second mesa and laterally extends towards the first mesa while not laterally overlapping therewith; and providing a barrier zone of the first conductivity type being arranged between the guidance zone and the trench structure, wherein the barrier zone has a dopant concentration at least twice as great as the dopant concentration of the drift region.

The methods described above may also include, at least partially, before or after providing the guidance zone, pre-processing and/or post-processing the semiconductor body such that it exhibits the configuration explained above.

Exemplary embodiments of the methods correspond to the exemplary embodiments of the power semiconductor device described with respect to the drawings. Thus, it is referred to the above.

Figure 16:
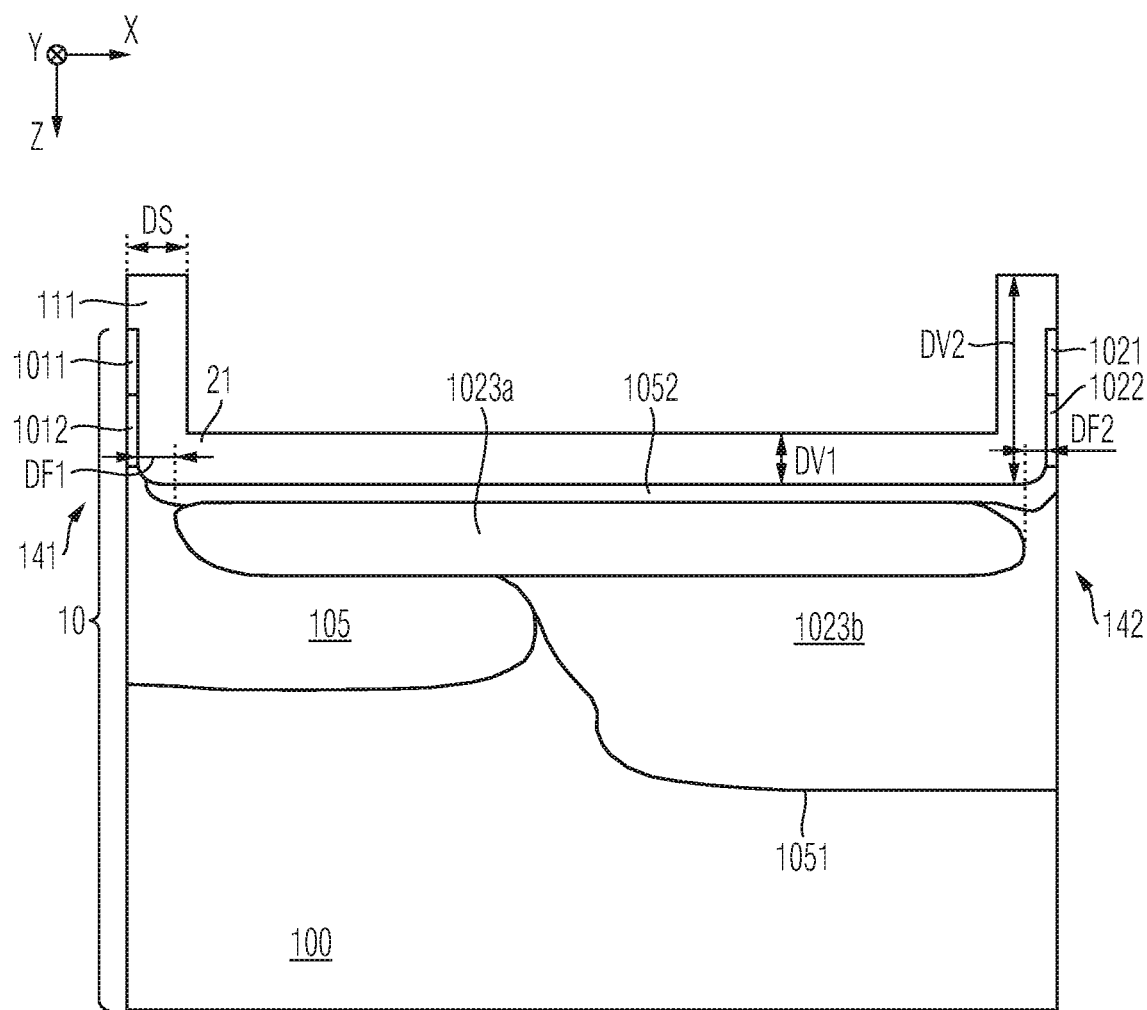

In accordance with an embodiment of the method, as illustrated in FIG. 16, a spacer element 21 can be employed within the scope of providing the guidance zone 1023. For example, providing the guidance zone 1023 may include one or more implantation processing steps, e.g., depicted by a first guidance subzone 1023*a* and a second guidance subzone 1023*b* as shown in FIG. 16. Also providing the barrier zone 105 may include one or more implantation processing steps. For example, the spacer element 21 is removed after the first guidance subzone region 1023*a* has been provided and, e.g., before the barrier zone 105 is provided. A lateral distance DF1 between the first mesa 101 and the first guidance subzone 1023*a* may be provided by a lateral thickness DS of the spacer element 21 at the sidewall of the first mesa 101 locally masking an ion implantation step at the location of the first mesa 101. Due to lateral straggling of the implanted ions the lateral distance DF1 is smaller than the lateral thickness DS of the spacer element 21. Accordingly, a lateral distance DF2 between the second mesa 102 and the first guidance subzone 1023*a* may be provided. The energy of the implanted ions may be configured in a way that they overcome a vertical thickness DV1 of the horizontal part of the spacer element 21 reaching the semiconductor body 10. However, the energy of the implanted ions may be too low to overcome a larger vertical thickness DV2 of the spacer element 21 at the first mesa 101 and second mesa 102 leading to a substantial blocking of the ion implantation at the position of the first mesa 101 and second mesa 102. For example, thereafter, the insulation structure 133 and the control electrode structure 13 are formed with the trench structure 17. The second guidance subzone 1023*b* may be provided either earlier or later in the process using e.g., ion implantation steps in combination conventional patterning with lithographic masks. The first guidance subzone 1023*a* and the second guidance subzone 1023*b* may be realized e.g., implanting boron or BF2 ions at different energies, in case the dopants of the second conductivity type are acceptors.

For example, providing the guidance zone 1023 and/or the barrier zone 105 (optionally including its one or more barrier subzones 1052) may be carried out in accordance with a self-aligned processing step as described above in detail.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to a power semiconductor device and to methods of processing a power semiconductor device were explained. For example, these embodiments are based on silicon (Si). Accordingly, a monocrystalline semiconductor region/zone/section/layer of exemplary embodiments can be a monocrystalline Si-region or Si-layer. In other embodiments, polycrystalline or amorphous silicon may be employed.

It should, however, be understood that the semiconductor regions/zones/sections/layers can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixCl-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device having a semiconductor body coupled to a first load terminal structure and a second load terminal structure, the semiconductor body comprising a drift region of a first conductivity type and being configured to conduct a load current during a conducting state of the power semiconductor device and to block a load current during a blocking state of the power semiconductor device, wherein the power semiconductor device includes a plurality of cells, each cell comprising:
   a first mesa included in a first cell portion, the first mesa including: a first port region of the first conductivity type being electrically connected to the first load terminal structure, and a first channel region being coupled to the drift region, wherein the first mesa exhibits a total extension of less than 100 nm in a lateral direction perpendicular to a vertical direction of the load current part within the first mesa;
   a second mesa included in a second cell portion, the second mesa including: a second port region of a second conductivity type and being electrically connected to the first load terminal structure, and a second channel region being coupled to the drift region;
   a trench structure including a control electrode structure that is configured to control the load current;
   wherein the first cell portion is configured to fully deplete the first channel region of mobile charge carriers of the second conductivity type in the conducting state,
   wherein the first cell portion is configured to induce a current path for mobile charge carriers of the first conductivity type in the first channel region in the conducting state and no current path for mobile charge carriers of the first conductivity type in the blocking state,
   a guidance zone of the second conductivity type arranged below the second channel region and being spatially displaced from both first and the second channel region along the vertical direction, wherein the guidance zone laterally overlaps with the second mesa and laterally extends towards the first mesa without laterally overlapping therewith in the lateral direction.

2. The power semiconductor device of claim 1, further comprising a barrier zone of the first conductivity type, wherein the barrier zone is arranged between the guidance zone and the trench structure.

3. The power semiconductor device of claim 2, wherein the barrier zone has a dopant concentration at least twice as great as the dopant concentration of the drift region.

4. A power semiconductor device having a semiconductor body coupled to a first load terminal structure and a second load terminal structure, the semiconductor body being configured to conduct a load current and comprising a drift region of a first conductivity type, wherein the power semiconductor device includes a plurality of cells, each cell comprising:
   a first mesa included in a first cell portion, the first mesa including: a first port region of the first conductivity type being electrically connected to the first load terminal structure, and a first channel region being coupled to the drift region;

a second mesa included in a second cell portion, the second mesa including: a second port region of a second conductivity type and being electrically connected to the first load terminal structure, and a second channel region being coupled to the drift region;

a trench structure including a control electrode structure for controlling the load current at least by means of a conductive channel in the first channel region;

a guidance zone of the second conductivity type arranged below the second channel region, wherein the guidance zone laterally overlaps with the second mesa and laterally extends towards the first mesa while not laterally overlapping therewith in the lateral direction;

a barrier zone of the first conductivity type being arranged between the guidance zone and the trench structure, wherein the barrier zone has a dopant concentration at least twice as great as the dopant concentration of the drift region.

5. The power semiconductor device of claim 4, wherein the guidance zone is spatially displaced from both the first and the second channel region along a vertical direction of the load current part within the first mesa, and wherein the first mesa exhibits a total extension of less than 100 nm in a lateral direction perpendicular to the vertical direction.

6. The power semiconductor device of claim 5, wherein the control electrode structure includes a first control electrode that is configured to control both the conductive channel in the first channel region and an accumulation channel in the second channel region, and wherein the guidance zone laterally overlaps with the first control electrode along the lateral direction for at least 60% of the total lateral extension of the first control electrode.

7. The power semiconductor device of claim 5, wherein the trench structure comprises a first trench sidewall interfacing with the first mesa, a second trench sidewall interfacing with second mesa, and a trench bottom between the first trench sidewall and the second trench sidewall, and wherein the trench bottom interfaces with the barrier zone.

8. The power semiconductor device of claim 7, further comprising an insulation structure isolating the control electrode structure within the trench structure, and wherein a first thickness along the lateral direction of the insulation structure between the first trench sidewall and the control electrode structure is less than a half of a second thickness along the vertical direction of the insulation structure between the trench bottom and the control electrode structure.

9. The power semiconductor device of claim 8, wherein, within a transition subregion of the trench structure, the trench bottom and the first trench sidewall merge with each other and the thickness of the insulator structure increases from the first thickness to the second thickness.

10. The power semiconductor device of claim 5, wherein the first mesa has a mesa opening with a width at least twice as large as the total extension of the first mesa in the lateral direction.

11. The power semiconductor device of claim 5, wherein a thickness of the guidance zone decreases by a factor of at least two as the guidance zone laterally extends towards the first mesa, and wherein a distance between the trench structure and the guidance zone remains substantially constant as the guidance zone laterally extends towards the first mesa.

12. The power semiconductor device of claim 5, wherein a maximum thickness of the guidance zone along the vertical direction amounts to less than one tenth of the total extension of the semiconductor body along the vertical direction.

13. The power semiconductor device of claim 4, wherein the guidance zone exhibits a dopant concentration of at least $10^{15}$ cm$^{-3}$, and wherein the guidance zone is separated from the second load terminal structure at least by means of the drift region.

14. The power semiconductor device of claim 4, wherein the barrier zone comprises a barrier subzone in contact with the trench bottom, wherein the barrier subzone has a dopant concentration at least as great as the dopant concentration of the drift region.

15. The power semiconductor device of claim 14, wherein the barrier subzone contacts the trench bottom within the transition subregion.

16. The power semiconductor device of claim 4, wherein at least the barrier region separates the second channel region and the guidance zone from each other.

17. The power semiconductor device of claim 4, wherein a connection between the second channel region and the guidance zone exhibits a first electric conductivity during a first operational state of the power semiconductor device and a second electric conductivity during a second operational state, the second electric conductivity being greater than the first electric conductivity by a factor of at least ten.

18. The power semiconductor device of claim 17, wherein the power semiconductor device is configured such that, during the transition from the first operational state to the second operational state, the electrical potential of the guidance zone deviates by at most 3 V from the electrical potential of the first load terminal structure.

19. The power semiconductor device of claim 4, wherein, during a blocking state of the power semiconductor device and during a transition from a conducting state to the blocking state, the guidance zone is configured to guide, along a path between the first mesa and the second mesa, at least one of charge carriers of the second conductivity type and an electrical potential different from the electrical potential of the second channel region by at least 50 mV and less than 2 V.

20. The power semiconductor device of claim 4, wherein both the first channel region and the second channel region are of the second conductivity type.

21. A method of processing a power semiconductor device having a semiconductor body coupled to a first load terminal structure and a second load terminal structure, the semiconductor body being configured to conduct a load current and comprising a drift region of a first conductivity type, wherein the power semiconductor device includes a plurality of cells, each cell comprising: a first mesa included in a first cell portion, the first mesa including: a first port region of the first conductivity type being electrically connected to the first load terminal structure, and a first channel region being coupled to the drift region; a second mesa included in a second cell portion, the second mesa including: a second port region of the second conductivity type and being electrically connected to the first load terminal structure, and a second channel region being coupled to the drift region; and a trench structure including a control electrode structure for controlling the load current at least by means of a conductive channel in the first channel region;

wherein the method comprises:
a) providing the first mesa with a total extension of less than 100 nm in a lateral direction perpendicular to a vertical direction of the load current part within the first mesa; and providing a guidance zone of a second conductivity type arranged below the second channel region while being spatially displaced from both the first and the second channel region along the vertical direction, wherein the guidance zone laterally overlaps with the second mesa and laterally extends towards the first mesa while not laterally overlapping therewith; and/or b) providing a guidance zone of a second conductivity type arranged below the second channel region, wherein the guidance zone laterally overlaps with the second mesa and laterally extends towards the first mesa while not laterally overlapping therewith; and providing a barrier zone of the first conductivity type being arranged between the guidance zone and the trench structure, wherein the barrier zone has a dopant concentration at least twice as great as the dopant concentration of the drift region.

* * * * *